(12) United States Patent
Hyeon et al.

(10) Patent No.: US 11,670,244 B2
(45) Date of Patent: *Jun. 6, 2023

(54) DISPLAY DEVICE

(71) Applicant: SAMSUNG DISPLAY CO., LTD., Yongin-si (KR)

(72) Inventors: Ju Hee Hyeon, Yongin-si (KR); Hyun Chol Bang, Yongin-si (KR); So Young Lee, Yongin-si (KR); Young Taeg Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/740,065

(22) Filed: May 9, 2022

(65) Prior Publication Data

US 2022/0262319 A1 Aug. 18, 2022

Related U.S. Application Data

(63) Continuation of application No. 16/055,606, filed on Aug. 6, 2018, now Pat. No. 11,328,676.

(30) Foreign Application Priority Data

Nov. 9, 2017 (KR) .................. 10-2017-0148647

(51) Int. Cl.
*G09G 3/3275* (2016.01)
*H01L 27/32* (2006.01)
(Continued)

(52) U.S. Cl.
CPC ......... *G09G 3/3275* (2013.01); *G09G 3/3266* (2013.01); *H01L 27/3276* (2013.01); *H01L 51/0097* (2013.01); *G09G 2310/08* (2013.01)

(58) Field of Classification Search
CPC ............... G09G 3/3275; G09G 3/3266; G09G 2310/08; H01L 27/3276; H01L 51/0097
See application file for complete search history.

(56) References Cited

U.S. PATENT DOCUMENTS 9,224,352 B2 12/2015 Watanabe et al.
9,530,374 B2 12/2016 Jeong et al.
(Continued)

FOREIGN PATENT DOCUMENTS

CN 104732908 6/2015
CN 104778912 7/2015
(Continued)

OTHER PUBLICATIONS

Office Action issued from the Chinese Patent Office dated Mar. 1, 2022 in the corresponding Chinese Patent Appln. No. 201811299586.0.

(Continued)

*Primary Examiner* — William Boddie
*Assistant Examiner* — Saifeldin E Elnafia
(74) *Attorney, Agent, or Firm* — F. Chau & Associates, LLC

(57) ABSTRACT

A display device includes a substrate including a display area and a peripheral area, a pixel area, a data driver, a data divider, and coupling lines that couple the data driver to the data divider. The pixel area includes first pixel lines in a first area of the display area and coupled to first area data lines, and second pixel lines disposed in a second area of the display area and coupled to second area data lines. The data driver outputs data signals corresponding to the first and second pixel lines. The data divider includes first selectors that transfer the data signals corresponding to the first pixel lines to the first area data lines, and second selectors that transfer the data signals corresponding to the second pixel (Continued)

lines to the second area data lines. A distance between adjacent second selectors is shorter than a distance between adjacent first selectors.

20 Claims, 15 Drawing Sheets

(51) Int. Cl.
    *H01L 51/00*     (2006.01)
    *G09G 3/3266*     (2016.01)

(56) References Cited

U.S. PATENT DOCUMENTS

| | | | |
|---|---|---|---|
| 9,607,581 B2 | 3/2017 | Park et al. | |
| 9,837,038 B2 | 12/2017 | Lee | |
| 10,186,191 B2 | 1/2019 | Kang et al. | |
| 2005/0265400 A1* | 12/2005 | Shin | G09G 3/325 370/540 |
| 2006/0123293 A1* | 6/2006 | Kim | G09G 3/3291 714/724 |
| 2006/0139255 A1 | 6/2006 | Kim et al. | |
| 2013/0141320 A1 | 6/2013 | Kim | |
| 2015/0199936 A1 | 7/2015 | Watanabe et al. | |
| 2015/0287378 A1 | 10/2015 | Jeong et al. | |
| 2016/0055789 A1 | 2/2016 | Hashimoto | |
| 2016/0093260 A1 | 3/2016 | Watsuda | |
| 2016/0232837 A1 | 8/2016 | Lee | |
| 2016/0260367 A1 | 9/2016 | Kwak et al. | |
| 2017/0076655 A1 | 3/2017 | Jeong et al. | |
| 2019/0140036 A1 | 5/2019 | Hyeon et al. | |

FOREIGN PATENT DOCUMENTS

| | | |
|---|---|---|
| CN | 104916245 | 9/2015 |
| CN | 107025875 | 8/2017 |
| KR | 10-2015-0116015 | 10/2015 |
| KR | 10-2016-0108639 | 9/2016 |

OTHER PUBLICATIONS

Final Office Action dated Oct. 5, 2021 in corresponding U.S. Appl. No. 16/055,606.

Office Action dated Jun. 25, 2021 in corresponding U.S. Appl. No. 16/055,606.

Final Office Action dated Jan. 6, 2021 in corresponding U.S. Appl. No. 16/055,606.

* cited by examiner

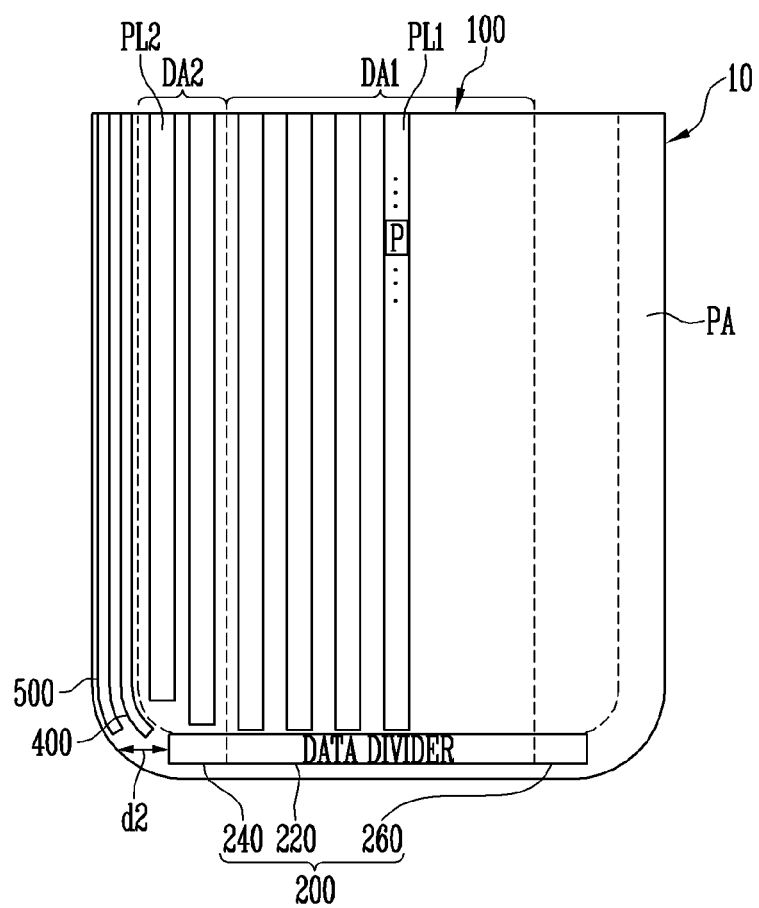

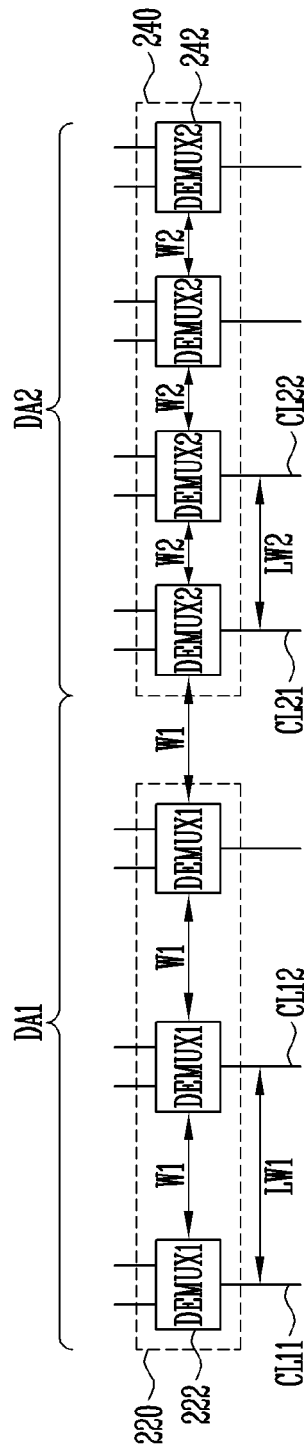
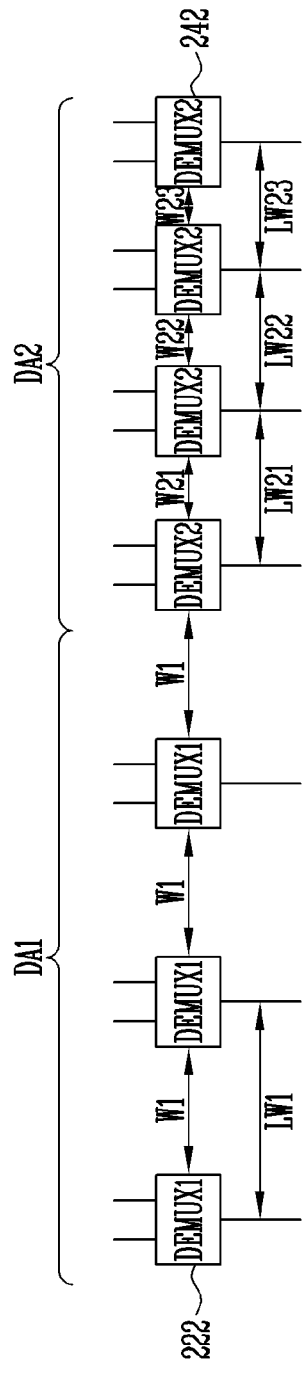

DISPLAY DEVICE

CROSS-REFERENCE TO RELATED APPLICATIONS

This application is a continuation application of U.S. patent application Ser. No. 16/055,606 filed Aug. 6, 2018, which claims priority under 35 U.S.C. § 119 to Korean Patent Application No. 10-2017-0148647 filed on Nov. 9, 2017, the disclosures of which is incorporated by reference herein in their entirety.

TECHNICAL FIELD

Exemplary embodiments of the present inventive concept relate to a display device, and more particularly, to a display device to which time-division driving for data is applied.

DISCUSSION OF THE RELATED ART

Display devices display images using light emitted from pixels. Organic light emitting display devices include pixels, each having an organic light emitting diode. With the implementation of high-resolution display devices, the number of driving circuits and various types of wires, lines, etc. included in display devices has increased. As the bezels of display devices become slimmer, less space is available to dispose such wires, lines, etc.

A data divider may be utilized to control the output of a data driver in display devices that include an increased number of wires, lines, etc. The data divider may perform time division by dividing a data writing time into time slots so as to reduce the number of output channels (wires or lines) of the data driver.

SUMMARY

Exemplary embodiments of the present inventive concept are directed to a display device that secures sufficient design space in a peripheral area of the display device by adjusting intervals at which selectors included in a data divider are arranged.

According to an exemplary embodiment of the present inventive concept, a display device includes a substrate including a display area and a peripheral area adjacent to the display area, and a pixel area disposed in the display area. The pixel area includes a plurality of first pixel lines disposed in a first area of the display area and respectively coupled to first area data lines disposed in the first area, and a plurality of second pixel lines disposed in a second area of the display area adjacent to the first area and respectively coupled to second area data lines disposed in the second area. The display device further includes a data driver disposed in the peripheral area and configured to output a plurality of data signals corresponding to the first and second pixel lines, respectively, and a data divider disposed in the peripheral area between the pixel area and the data driver. The data divider includes a plurality of first selectors configured to transfer the data signals corresponding to the first pixel lines to the first area data lines, and a plurality of second selectors configured to transfer the data signals corresponding to the second pixel lines to the second area data lines. The display device further includes a plurality of coupling lines configured to couple the data driver to the data divider. A distance between adjacent second selectors is shorter than a distance between adjacent first selectors.

In an exemplary embodiment, at least one corner portion of the substrate has either a curved shape or a diagonal shape with respect to the first and second pixel lines.

In an exemplary embodiment, a boundary of at least one corner portion of the pixel area has either a curved shape or a diagonal shape with respect to the first and second pixel lines.

In an exemplary embodiment, at least one corner portion of the pixel area corresponds to the second area.

In an exemplary embodiment, the first and second pixel lines correspond to respective pixel columns, and lengths of the second pixel lines are shorter than lengths of the first pixel lines.

In an exemplary embodiment, a number of effective pixels included in each of the second pixel lines is less than a number of effective pixels included in each of the first pixel lines.

In an exemplary embodiment, the distance between the adjacent second selectors is decreased at preset intervals in a direction farther away from the first area.

In an exemplary embodiment, the distance between the adjacent first selectors is a first distance, and the distance between the adjacent second selectors is a second distance shorter than the first distance.

In an exemplary embodiment, with respect to a center of the first area corresponding to the first selectors, a distance between adjacent selectors from the first selectors to the second selectors is decreased at preset intervals in a direction farther away from the center of the first area.

In an exemplary embodiment, each of the first selectors and the second selectors is a 1:N (where N is a positive integer equal to at least 2) demultiplexer configured to perform time-division driving for data.

In an exemplary embodiment, the 1:N demultiplexer includes N switching transistors that are respectively controlled in response to N selection signals having different timings.

In an exemplary embodiment, the distance between the adjacent first selectors and the distance between the adjacent second selectors are respective distances between adjacent switching transistors in different adjacent selectors.

In an exemplary embodiment, sizes of switching transistors included in each of the second selectors is smaller than sizes of switching transistors included in each of the first selectors.

In an exemplary embodiment, a distance between switching transistors included in each of the second selectors is shorter than a distance between switching transistors included in each of the first selectors.

In an exemplary embodiment, the coupling lines include first coupling lines configured to couple the data driver to the respective first selectors, and second coupling lines configured to couple the data driver to the respective second selectors. Distances between second selector-side portions of adjacent second coupling lines are shorter than distances between first selector-side portions of adjacent first coupling lines.

In an exemplary embodiment, the distances between the selector-side portions of the adjacent second coupling lines are decreased at preset intervals in a direction farther away from the first area.

In an exemplary embodiment, the display device further includes a plurality of additional coupling lines configured to couple the second area data lines to the respective second selectors.

In an exemplary embodiment, the first area data lines and the second area data lines extend substantially parallel to the first and second pixel lines, and the additional coupling lines extend diagonally with respect to the second area data lines.

According to an exemplary embodiment of the present inventive concept, a display device includes a substrate including a display area and a peripheral area adjacent to the display area, and a pixel area disposed in the display area. The pixel area includes a plurality of first pixel lines disposed in a first area of the display area and respectively coupled to first area data lines disposed in the first area, and a plurality of second pixel lines disposed in a second area of the display area adjacent to the first area and respectively coupled to second area data lines disposed in the second area. The display device further includes a data driver disposed in the peripheral area and configured to output a plurality of data signals corresponding to the first and second pixel lines, respectively, and a data divider disposed in the peripheral area between the pixel area and the data driver. The display device further includes a data divider including a plurality of first selectors configured to transfer the data signals corresponding to the first pixel lines to the first area data lines, and a plurality of second selectors configured to transfer the data signals corresponding to the second pixel lines to the second area data lines. The display device further includes a plurality of first coupling lines configured to couple the data driver to the respective first selectors, and a plurality of second coupling lines configured to couple the data driver to the respective second selectors. A distance between second selector-side portions of adjacent second coupling lines is shorter than a distance between first selector-side portions of adjacent first coupling lines.

In an exemplary embodiment, lengths of the second pixel lines are shorter than lengths of the first pixel lines.

In an exemplary embodiment, at least one corner portion of the substrate has either a curved shape or a diagonal shape with respect to the first and second pixel lines.

In an exemplary embodiment, the distance between the second selector-side portions of the adjacent second coupling lines is decreased at preset intervals in a direction farther away from the first area.

In an exemplary embodiment, the distance between the first selector-side portions of the adjacent first coupling lines is a first line distance, and the distance between the second selector-side portions of the adjacent second coupling lines is a second line distance shorter than the first line distance.

In an exemplary embodiment, a distance between adjacent second selectors is shorter than a distance between adjacent first selectors.

In an exemplary embodiment, the display device further includes a plurality of additional coupling lines configured to couple the second area data lines to the respective second selectors. The additional coupling lines extend diagonally with respect to the second area data lines.

According to an exemplary embodiment of the present inventive concept, a display device includes a substrate including a display area and a peripheral area adjacent to the display area, and a pixel area disposed in the display area. The pixel area includes a plurality of first pixel lines disposed in a first area of the display area and respectively coupled to first area data lines disposed in the first area, and a plurality of second pixel lines disposed in a second area of the display area adjacent to the first area and respectively coupled to second area data lines disposed in the second area. The display device further includes a data divider including a plurality of first selectors configured to selectively transfer data signals to the first area data lines, and a plurality of second selectors configured to selectively transfer the data signals to the second area data lines. The display device further includes a plurality of coupling lines configured to respectively couple the second area data lines to the second selectors. The coupling lines extend diagonally with respect to the second area data lines, and a distance between adjacent second selectors is shorter than a distance between adjacent first selectors.

In an exemplary embodiment, at least one corner of the substrate has either a curved shape or a diagonal shape with respect to the first and second pixel lines.

In an exemplary embodiment, the first and second pixel lines respectively correspond to pixel columns, and lengths of the second pixel lines are shorter than lengths of the first pixel lines.

BRIEF DESCRIPTION OF THE DRAWINGS

The above and other features of the present inventive concept will become more apparent by describing in detail exemplary embodiments thereof with reference to the accompanying drawings, in which:

FIGS. 2A and 2B are views schematically illustrating examples of a substrate included in the display device of FIG. 1 according to exemplary embodiments of the present inventive concept.

FIGS. 8A to 8E are diagrams schematically illustrating examples of the arrangement of a data divider included in the display device of FIG. 5A according to exemplary embodiments of the present inventive concept.

DETAILED DESCRIPTION OF THE EXEMPLARY EMBODIMENTS

Figure 1:
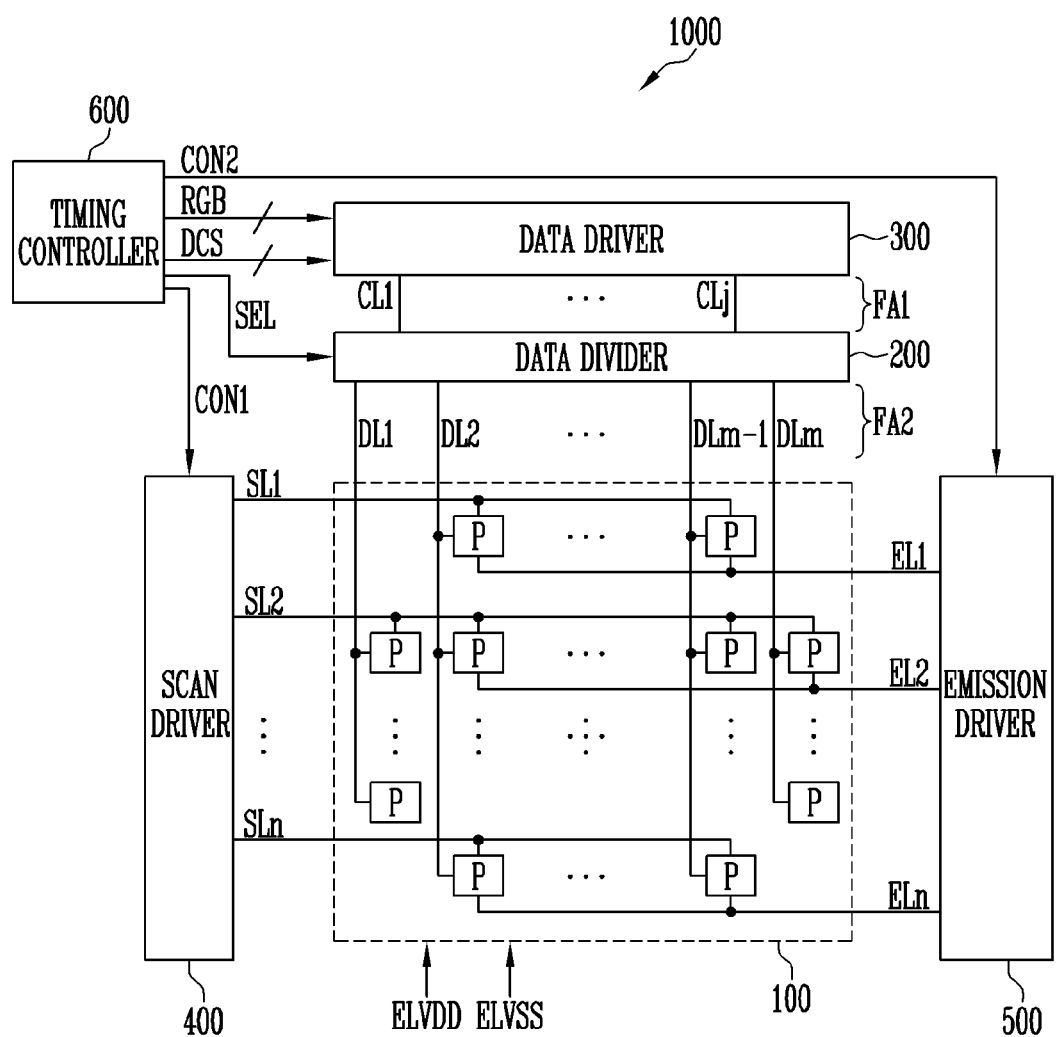
FIG. 1 is a block diagram illustrating a display device according to exemplary embodiments of the present inventive concept.

Exemplary embodiments of the present inventive concept will be described more fully hereinafter with reference to the accompanying drawings. Like reference numerals may refer to like elements throughout the accompanying drawings.

It will be understood that when a component is referred to as being "on", "connected to", "coupled to", or "adjacent to" another component, it can be directly on, connected to, coupled to, or adjacent to the other component, or intervening components may also be present. It will also be understood that when a component is referred to as being "between" two components, it can be the only component between the two components, or one or more intervening components may also be present.

It will be further understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as, identical to, or about equal to each other, it is to be understood that the elements or values are identical to each other, indistinguishable from each other, or distinguishable from each other but functionally the same as each other as would be understood by a person having ordinary skill in the art. Further, when two components or directions are described as extending substantially parallel or perpendicular to each other, the two components or directions extend exactly parallel or perpendicular to each other, or extend approximately parallel or perpendicular to each other as would be understood by a person having ordinary skill in the art.

As is traditional in the field of the present inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies.

FIG. 1 is a block diagram illustrating a display device according to exemplary embodiments of the present inventive concept.

Referring to FIG. 1, in an exemplary embodiment, a display device 1000 includes a pixel area 100, a scan driver 400 (also referred to as a scan driver circuit 400), an emission driver 500 (also referred to as an emission driver circuit 500), a data driver 300 (also referred to as a data driver circuit 300), a data divider 200 (also referred to as a data divider circuit 200), and a timing controller 600 (also referred to as a timing controller circuit 600).

The display device 1000 may be implemented as an organic light emitting display device, a liquid crystal display device, etc. The display device 1000 may be, for example, a flat panel display device, a flexible display device, a curved display device, a foldable display device, or a bendable display device. Further, the display device may be applied to a transparent display device, a head-mounted display device, a wearable display device, etc.

The pixel area 100 may be provided in a display area on the substrate. The pixel area 100 may include a plurality of scan lines SL1 to SLn, a plurality of emission control lines EL1 to ELn, and a plurality of data lines DL1 to DLm, and may include a plurality of pixels P coupled to respective scan lines SL1 to SLn, respective emission control lines EL1 to ELn, and respective data lines DL1 to DLm (where n and m are integers equal to at least 1). Each of the pixels P may include a driving transistor and a plurality of switching transistors. In an exemplary embodiment, each of the pixels P may include an organic light emitting diode, and may be implemented as one of a first pixel, a second pixel, and a third pixel. For example, each of the first to third pixels may be implemented as one of a green pixel, a red pixel, and a blue pixel. Further, each of the pixels P may be implemented as one of a green pixel, a red pixel, a blue pixel, and a white pixel. Voltages ELVDD and ELVSS may be applied to the pixel area 100.

According to exemplary embodiments, the pixel area 100 is formed such that the boundary of a corner portion thereof has a curved shape.

The scan driver 400 may apply scan signals to the scan lines SL1 to SLn in response to a first control signal CON1 provided by the timing controller 600. In an exemplary embodiment, the scan driver 400 may be integrated on a substrate.

The emission driver 500 may apply emission control signals to the emission control lines EL1 to ELn in response to a second control signal CON2 provided by the timing controller 600.

The data driver 300 may apply data signals (e.g., data voltages) to a plurality of coupling lines CL1 to CLj (where j is a positive integer less than m) in response to a data control signal DCS and image data RGB which are provided by the timing controller 600. The data driver 300 may be integrated on a printed circuit film (e.g., a flexible printed circuit film (FPC)) attached to (e.g., mounted on) the substrate, or may be directly disposed on the substrate. The coupling lines CL1 to CLj may be disposed in a first coupling area (a fan-out area, FA1) on the substrate, and in an exemplary embodiment including a printed circuit film, the coupling lines CL2 to CLj may electrically couple the printed circuit film to the data divider. The fan-out areas FA1 and FA2 illustrated in FIG. 1 are described in further detail below.

In an exemplary embodiment, the data divider 200 selectively provides data voltages to the data lines DL1 to DLm coupled to respective pixels P (e.g., in a time-division driving manner) in response to a selection control signal SEL. In an exemplary embodiment, the data divider include a plurality of demultiplexers. For example, each demultiplexer may transfer a data voltage from a single output line (e.g., coupling line) to one of the N data lines through N (where N is an integer that is equal to or greater than 2, and that is less than or equal to 6) switches (e.g., metal oxide semiconductor [MOS] transistors). For example, in an exemplary embodiment, the display device 1000 time-divides the data voltage by the unit of data lines by driving the data lines using a demultiplexer (demux) driving method, and then providing time-divisional data voltages to the pixels P.

The timing controller 600 may receive RGB image signals, a vertical synchronization (SYNC) signal, a horizontal SYNC signal, a main clock signal, a data enable signal, etc. from an external graphics controller, and may generate, based on the received signals, the first control signal CON1, the second control signal CON2, the data control signal DCS, and the image data RGB corresponding to the RGB image signals. The timing controller 600 may provide the first control signal CON1 to the scan driver 400, provide the second control signal CON2 to the emission driver 500, provide both the image data RGB and the data control signal DCS to the data driver 300, and provide the selection control signal SEL to the data divider 200.

Figure 2A:
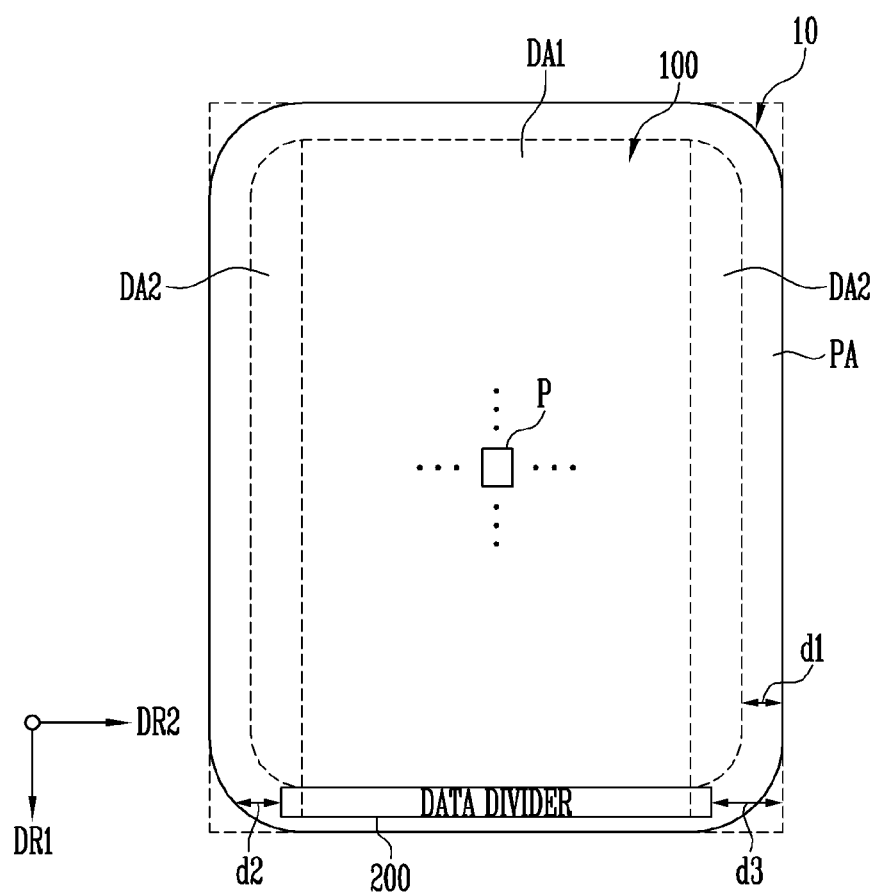

FIGS. 2A and 2B are views schematically illustrating examples of a substrate included in the display device of FIG. 1 according to exemplary embodiments of the present inventive concept.

Referring to FIGS. 1, 2A, and 2B, a substrate 10 may include display areas DA1 and DA2 including the pixel area 100, and a peripheral area PA disposed adjacent to (e.g., disposed around) the display areas DA1 and DA2. Display area DA1 may also be referred to herein as a first area DA1, and display area DA2 may also be referred to herein as a second area DA2. In an exemplary embodiment, the data divider 200 is disposed in the peripheral area PA of the substrate 10 on one side of the pixel area 100.

The substrate 10 has a plurality of corners. The planar shape of the substrate 10 (or a panel) may be used to determine the planar shape of the display device 1000 or the display panel. In an exemplary embodiment, at least one corner portion of the substrate 10 has a curved shape that is convex toward the outside of the substrate 10. For example, the substrate 10 may have a rectangular shape having curved corner portions. However, it is to be understood that this structure is exemplary, and that the planar shape of the substrate 10 is not limited thereto. For example, in exemplary embodiments, the substrate 10 may have the shape of a polygon, at least one corner of which has a diagonal shape with respect to a pixel row direction (or a pixel column direction). Alternatively, the substrate 10 may be provided in any of various shapes such as, for example, a closed polygon having straight sides, a circle or an ellipse having curved sides, and a semicircle or a semi-ellipse having a straight side and a curved side.

In an exemplary embodiment, the substrate 10 may include a flexible material. For example, the substrate 10 may be a polymer substrate, which may be implemented using a transparent insulating substrate such as, for example, a substrate made of a polymer material having transparency and a predetermined flexibility. However, exemplary embodiments are not limited thereto. For example, in an exemplary embodiment, the substrate 10 may be a rigid substrate including a glass or plastic material.

The display areas DA1 and DA2 correspond to the pixel area 100 including a plurality of pixels P. Accordingly, a predetermined image may be displayed in the display areas DA1 and DA2. The display areas DA1 and DA2 may include a first display area DA1 and a second display area DA2 disposed adjacent to the first display area DA1, as shown in FIGS. 2A and 2B. In an exemplary embodiment, the first display area DA1 is an area including pixels P which receive data signals from first selectors included in the data divider 200, and the second area DA2 is an area including pixels P which receive data signals from second selectors included in the data divider 200. For example, the first pixel lines PL1 included in the first display area DA1 are coupled to first area data lines, respectively, and the second pixel lines PL2 included in the second display area DA2 are coupled to second area data lines, respectively.

The first pixel lines PL1 and the second pixel lines PL2 may be defined as pixel columns that are arranged substantially in parallel to the data lines. A single pixel line refers to a pixel column coupled to a single data line corresponding thereto. For example, the data lines DL1 to DLm, the first pixel lines PL1, and the second pixel lines PL2 extend in a first direction DR1. The first direction DR1 is a vertical direction (e.g., a pixel column direction). Accordingly, the second display area DA2 is adjacent to the sides of the first display area DA1 in a second direction DR2 (e.g., a pixel row direction or a horizontal direction) that crosses the first direction DR1.

In an exemplary embodiment, the lengths of the first pixel lines PL1 arranged in the first area DA1 are substantially identical to each other. For example, since the lengths of the first pixel lines PL1 are substantially equal to one another, the first pixel lines PL1 may include an identical number of effective pixels. The term "effective pixels" refers to pixels that actually emit light to allow a user to view an image. However, exemplary embodiments of the present inventive concept are not limited thereto. For example, in exemplary embodiments, the lengths of the first pixel lines PL1 may be different from one another. For example, the lengths of some of the first pixel lines PL1 may be different from those of the remaining first pixel lines PL1.

In an exemplary embodiment, the lengths of the second pixel lines PL2 arranged in the second area DA2 are shorter than the lengths of the first pixel lines PL1. Since the lengths of the second pixel lines PL2 are shorter than the lengths of the first pixel lines PL1, the number of effective pixels included in each second pixel line PL2 is less than the number of effective pixels included in each first pixel line PL1 in an exemplary embodiment. In this case, as illustrated in FIGS. 2A and 2B, in exemplary embodiments, corners of at least one of the pixel area 100 and the second display area DA2 have curved shapes that are convex. For example, at the boundaries of the corners of the pixel area 100, an image may be displayed in the shape of a curved line. However, exemplary embodiments of the present inventive concept are not limited thereto. For example, in an exemplary embodiment, at least one corner of the second area DA2 has a diagonal shape with respect to the first direction DR1 and the second direction DR2. For example, at the boundaries of the corners of the pixel area 100, an image may be displayed in the shape of a diagonal line with respect to the first direction DR1 and the second direction DR2.

In an exemplary embodiment, at least one corner portion of the substrate 10 has either a curved shape or a diagonal shape with respect to the first and second pixel lines PL1 and PL2.

In an exemplary embodiment, a boundary of at least one corner portion of the pixel area 100 has either a curved shape or a diagonal shape with respect to the first and second pixel lines PL1 and PL2.

In an exemplary embodiment, the boundary between the second area DA2 and the first area DA1 is not defined by the lengths of pixel lines (e.g., the boundary between the curved area and the rectangular area of the pixel area 100). Rather, the boundary between the second area DA2 and the first area DA1 may be defined by the first selectors and the second selectors included in the data divider 200. For example, the first area DA1 is defined by the pixels P coupled to the first selectors, and the second area DA2 is defined by the pixels P coupled to the second selectors. The data divider 200 may be divided into a first selector area 220 including the first selectors, and second selector areas 240 and 260 including the second selectors.

In the peripheral area PA, components (e.g., various types of drivers and wires) for driving the pixels P may be arranged. The peripheral area PA may be defined as a dead space (or a bezel) in which pixels P are not present, and may have a shape enclosing at least a part of the display areas DA1 and DA2. In an exemplary embodiment, the scan driver 400 and the emission driver 500 are arranged on at least one side of the peripheral area PA. The scan driver 400 and the emission driver 500 may be integrated on the substrate 10. The scan driver 400 and the emission driver 500 may have a shape in which some portions thereof are bent depending on the boundary shape of the pixel area 100. For example, some of stage circuits of the scan driver 400 may be arranged gradually closer to the center of the pixel area 100.

The corners of the peripheral area PA have curved shapes depending on the shape of the substrate 10. Therefore, linear parts of the peripheral area PA, in which the scan driver 400, power lines, etc. are arranged, may have a first width d1, but curved corner portions of the peripheral area PA may have a width less than the first width d1.

The width and space of the corner portions of the peripheral area PA utilized for arrangement of the scan driver 400, power lines, etc., in exemplary embodiments of the inventive concept may be narrowed more than the width d3 and space of the corner portions of a conventional rectangular substrate, as illustrated in FIG. 2A. Accordingly, less space is available in the corner portions of the peripheral area PA for wiring and stable arrangement of driving circuits in exemplary embodiments of the inventive concept compared to a conventional rectangular substrate.

To account for having less available space in the corner portions of the peripheral area PA compared to a conventional rectangular substrate, in exemplary embodiments, the data divider 200 includes a plurality of first selectors disposed in a first selector area 220 (see FIG. 2B) for transferring data signals to data lines disposed in the first display area DA1 (hereinafter referred to as first area data lines), and a plurality of second selectors disposed in second selector areas 240 and 260 (see FIG. 2B) for transferring data signals to data lines disposed in the second display area DA2 (hereinafter referred to as second area data lines). In exemplary embodiments, a distance between adjacent second selectors included in the plurality of second selectors is less than a distance between adjacent first selectors included in the plurality of first selectors. Therefore, the horizontal length of space occupied by the data divider 200 is less than the total horizontal length of the pixel area 100 (e.g., the maximum horizontal length of the pixel area 100). For example, the length of space occupied by the data divider 200 in the second direction DR2 is less than the length of space occupied by the pixel area 100 in the second direction DR2. Accordingly, in exemplary embodiments, the width d2 of the curved corner portion of the peripheral area PA provides sufficient space for the arrangement of the scan driver 400, power lines, etc. in the curved corner portion. For example, the width d2 of the curved corner portion may be secured as the level of the first width d1 or more.

In an exemplary embodiment, each of the first selectors and the second selectors is implemented as a 1:N demultiplexer (where N is a positive integer equal to at least 2). The 1:N demultiplexer may include N switching transistors which are respectively controlled in response to N selection signals having different timings.

A detailed structure and arrangement of the data divider 200 will be described with reference to FIGS. 6 to 11.

As described above, the display device 1000 according to exemplary embodiments of the present inventive concept are implemented using the substrate 10 having corner portions having a rounded shape (e.g., a curved shape). The display device 1000 includes the data divider 200 in which the second selectors are arranged at smaller intervals than the first selectors. As a result, the space horizontally occupied by the data divider 200 in the peripheral area PA of the substrate 10 is greatly reduced, providing space in the corner portion(s) of the peripheral area PA for the arrangement of various wires, lines, etc.

Figure 3A:
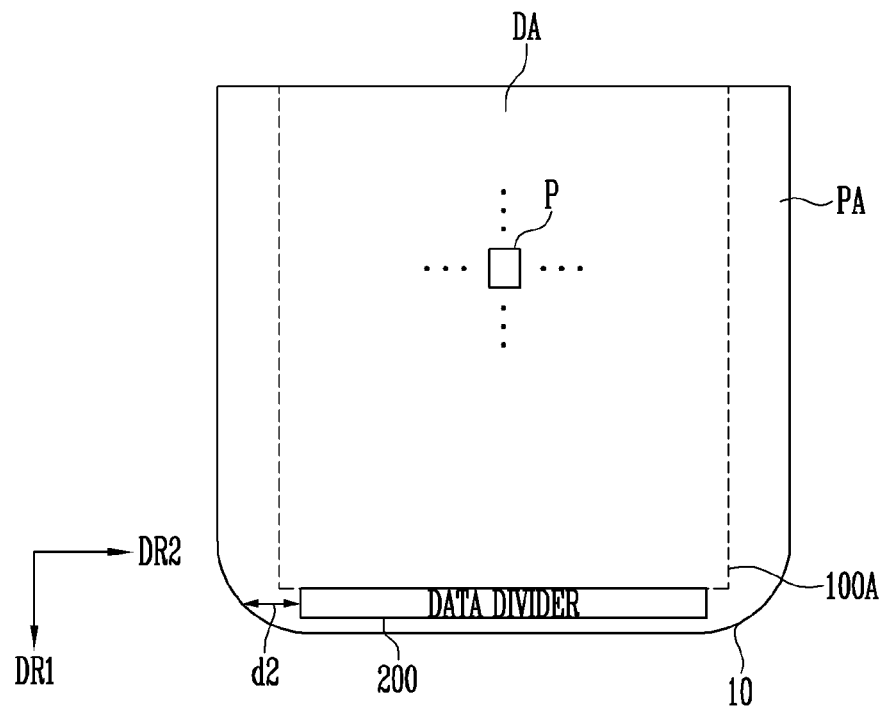
FIGS. 3A to 3C are views schematically illustrating examples of a substrate included in the display device of FIG. 1 according to exemplary embodiments of the present inventive concept.
Figure 3B:
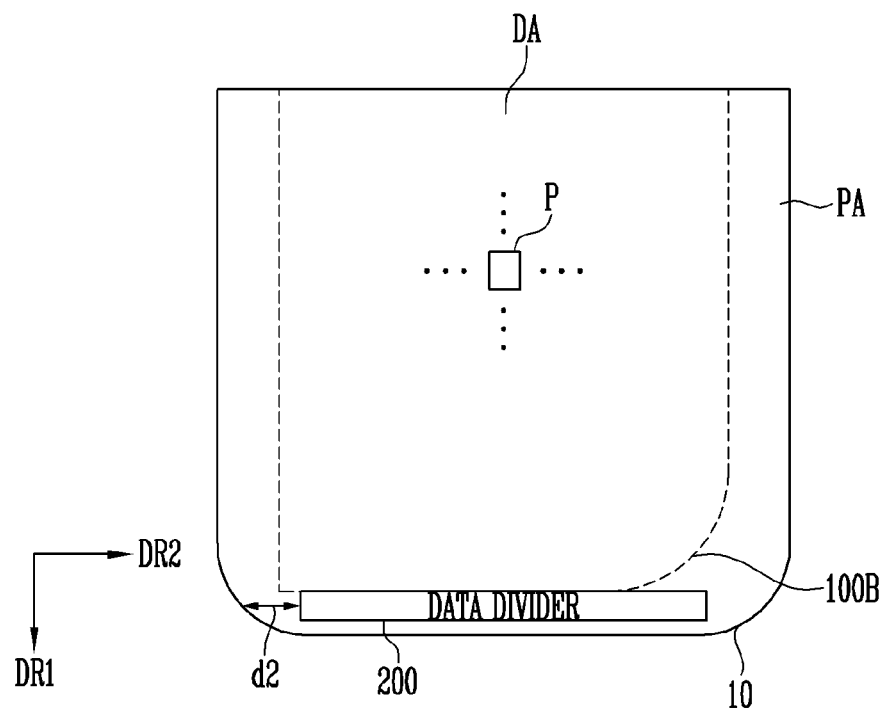
Figure 3C:
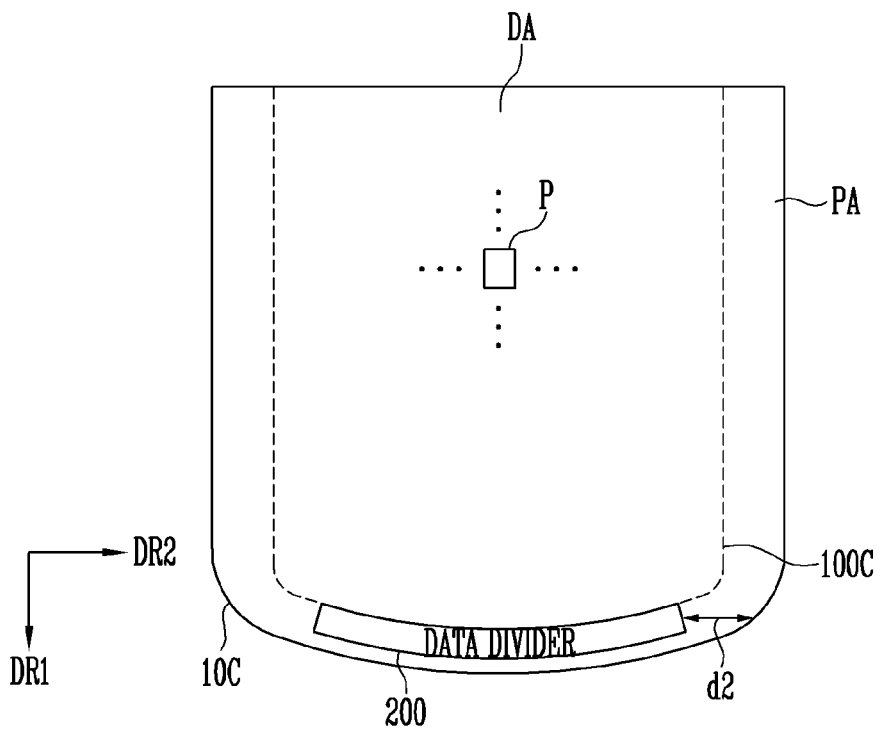

FIGS. 3A to 3C are views schematically illustrating examples of the substrate included in the display device of FIG. 1 according to exemplary embodiments of the inventive concept.

FIGS. 3A to 3C illustrate only a part of a substrate 10 or 10C. Referring to FIGS. 3A to 3C, in exemplary embodiments, the substrate 10 or 10C includes a display area DA including a pixel area 100A, 100B or 100C, and a peripheral area PA disposed adjacent to (e.g., disposed around) the display area DA.

At least one corner portion of the substrate 10 or 10C has a curved shape. Accordingly, the space available into which lines, wires, etc. are to be inserted in the corner portion of the substrate 10 or 10C is small compared to a conventional rectangular substrate, as described above.

The display area DA corresponds to the pixel area 100A, 100B or 100C, which includes a plurality of pixels P. In an exemplary embodiment, as illustrated in FIG. 3A, the display area DA and the pixel area 100A have a rectangular shape. For example, the corner portion of the display area DA corresponding to the curved corner portion of the substrate 10 is substantially right-angled, as shown in FIG. 3. For example, the lengths of pixel lines (e.g., the numbers of effective pixels included in respective pixel lines) included in the pixel area 100A may be identical to each other.

The data divider 200 may be arranged adjacent to one side of the display area DA on the substrate 10 or 10C. The data divider 200 may include a plurality of selectors, each being implemented as a 1:N demultiplexer, as described above. By adjusting a distance between adjacent selectors, the horizontal length of space occupied by the data divider 200 on the substrate 10 in the exemplary embodiment of FIG. 3A is less than the total horizontal length of the pixel area 100A. For example, the length of space occupied by the data divider 200 in the second direction DR2 is less than the length of space occupied by the pixel area 100A in the second direction DR2. Therefore, a sufficient amount of space in the curved corner portion(s) of the peripheral area PA in which various types of wires, lines, etc. are arranged is provided.

In an exemplary embodiment, as illustrated in FIG. 3B, a display area DA and a pixel area 100B have shapes in which only some, but not all, of the corner portions are curved. For example, in an exemplary embodiment, some of the corner portions of the display area DA corresponding to the curved corner portions of the substrate 10 are formed to be curved, and the remaining corner portions of the display area DA are formed to be substantially right-angled.

The horizontal length of space occupied by the data divider 200 in the substrate 10 in the exemplary embodiment of FIG. 3B may be less than the total horizontal length of the pixel area 100B. Therefore, a sufficient amount of space in the curved corner portion(s) of the peripheral area PA in which various types of wires, lines, etc. are arranged is provided.

In an exemplary embodiment, as illustrated in FIG. 3C, at least one side of each of the substrate 10C and the display area 100C have a curved shape. For example, one side of the substrate 10C and one side of the display area 100C, which are adjacent to the data divider 200, may have curved shapes. For example, the lengths of pixel lines may be shortened at predetermined intervals in a direction from the center toward the outer edge of the display area DA.

Here, the data divider 200 may be arranged along the boundary of the display area 100C. For example, a plurality of selectors included in the data divider 200 may be arranged in the shape of steps at predetermined intervals. In the substrate 10C in the exemplary embodiment of FIG. 3C, the horizontal length of space occupied by the data divider 200 is less than the total horizontal length of the pixel area 100C. For example, the length of space occupied by the data divider 200 in the second direction DR2 is less than the length of space occupied by the pixel area 100C in the second direction DR2. Therefore, space in the curved corner portion of the peripheral area PA in which various types of wires or lines are arranged may be sufficiently secured.

FIGS. 4A to 4D are views schematically illustrating examples of the substrate included in the display device of FIG. 1 according to exemplary embodiments of the present inventive concept.

FIGS. 4A to 4D illustrate only a part of a substrate 10D, 10E, 10F, or 10G. Referring to FIGS. 4A to 4D, the substrate 10D, 10E, 10F, or 10G includes a display area DA or DA1 and DA2 including a pixel area 100D, 100E, 100F, or 100G, and a peripheral area PA disposed adjacent to (e.g., disposed around) the display area DA or DA1 and DA2.

Figure 4A:
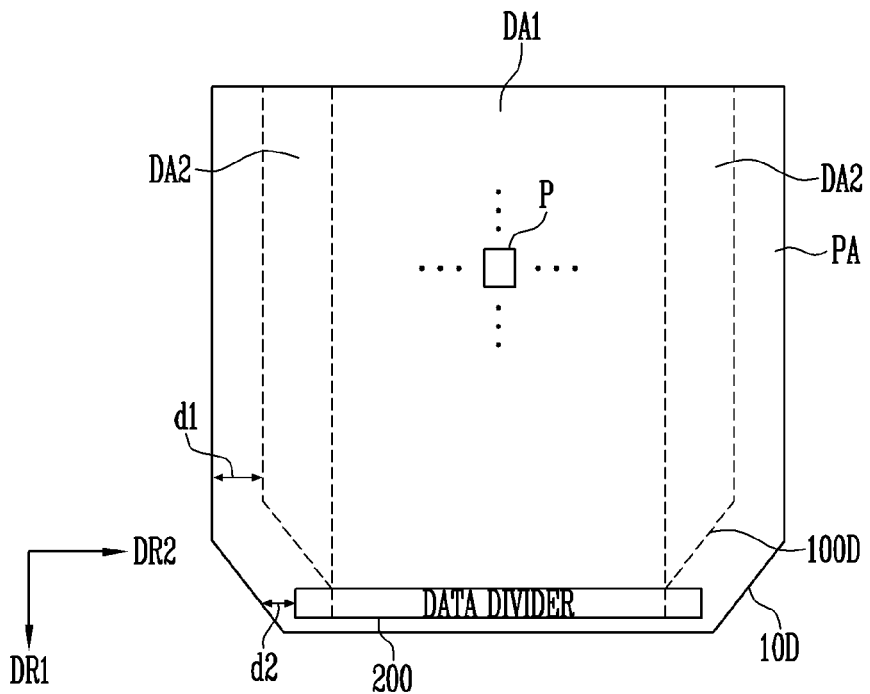
FIGS. 4A to 4D are views schematically illustrating examples of a substrate included in the display device of FIG. 1 according to exemplary embodiments of the present inventive concept.
Figure 4B:
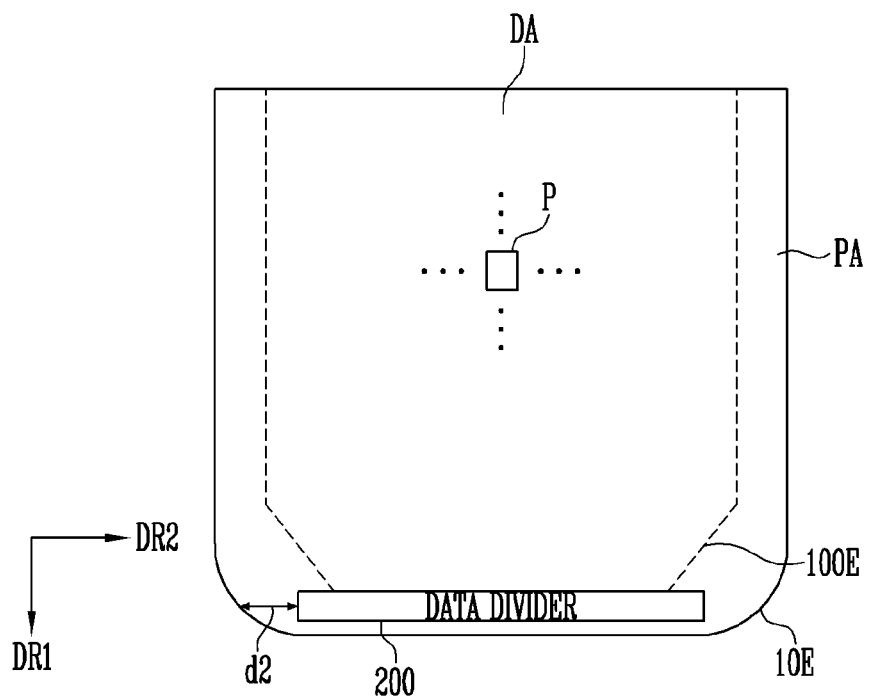

At least one corner portion of the substrate 10D, 10E, 10F, or 10G may have either a diagonal shape with respect to a first direction DR1 and a second direction DR2 (see FIGS. 4A, 4C, and 4D), or a curved shape (see FIG. 4B). Accordingly, the available space into which wires, lines, etc. are to be inserted in the corner portion(s) of the substrate 10D, 10E, 10F, or 10G is small compared to a conventional rectangular substrate.

The display area DA corresponds to the pixel area 100D, 100E, 100F, or 100G including a plurality of pixels P.

In an exemplary embodiment, as illustrated in FIG. 4A, corner portions of at least some of the display areas DA1 and DA2 and the pixel area 100D corresponding thereto have diagonal shapes with respect to first and second directions DR1 and DR2. For example, corner portions of at least some of the display areas DA1 and DA2 and the pixel area 100D corresponding thereto extend substantially in a straight line in a diagonal direction between the first and second directions DR1 and DR2. Corner portions of the substrate 10D correspond to the corner portions of the at least some of the display areas DA1 and DA2 and the pixel area 100D. For example, as shown in FIG. 4A, corner portions of the substrate 10D have corresponding diagonal shapes with respect to the first and second directions DR1 and DR2.

The display areas DA1 and DA2 may include the first display area DA1 and the second display area DA2 disposed adjacent to the first display area DA1 in the second direction DR2. The first display area DA1 refers to an area including pixels P which receive data signals from first selectors included in the data divider 200, and the second area DA2 refers to an area including pixels P which receive data signals from second selectors included in the data divider 200.

For example, the second display area DA2 may include pixel lines corresponding to diagonal corner portions on both sides of the first display area DAL In this case, the lengths of pixel lines included in the second display area DA2 (e.g., the numbers of effective pixels included in respective pixel lines) are shorter than those of pixel lines included in the first display area DAL The data divider 200 may be arranged adjacent to one side of each of the display areas DA1 and DA2 on the substrate 10D. The data divider 200 may include a plurality of selectors, each being implemented as a 1:N demultiplexer, as described above. By adjusting a distance between adjacent selectors, the horizontal length of space occupied by the data divider 200 on the substrate 10D in the exemplary embodiment of FIG. 4A is less than the total horizontal length of the pixel area 100D. For example, the length of space occupied by the data divider 200 in the second direction DR2 is less than the length of space occupied by the pixel area 100D in the second direction DR2. Therefore, a sufficient amount of space in the corner portion(s) of the peripheral area PA in which various types of wires, lines, etc. are arranged is provided.

In an exemplary embodiment, as illustrated in FIG. 4B, at least one corner portion of the substrate 10E has a curved shape, and at least one corner portion of each of the display area DA and the pixel area 100E has a diagonal shape with respect to a first direction DR1 and a second direction DR2. For example, the corner portions of the display area DA corresponding to the curved corner portions of the substrate 10E have diagonal shapes. For example, these corner portions extend substantially in a straight line in a diagonal direction between the first and second directions DR1 and DR2. The horizontal length of space occupied by the data divider 200 in the substrate 10E in the exemplary embodiment of FIG. 4B is less than the total horizontal length of the pixel area 100E. For example, the length of space occupied by the data divider 200 in the second direction DR2 is less than the length of space occupied by the pixel area 100E in the second direction DR2. Therefore, a sufficient amount of space in the diagonal corner portion(s) of the peripheral area PA in which various types of wires, lines, etc. are arranged is provided.

Figure 4C:
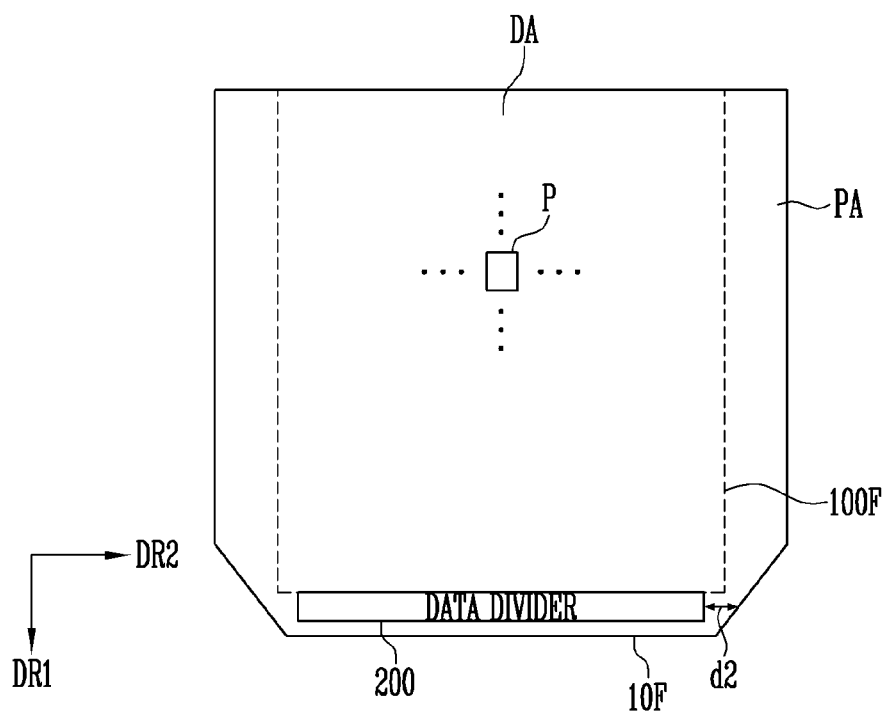

In an exemplary embodiment, as illustrated in FIG. 4C, at least one corner portion of the substrate 10F has a diagonal shape with respect to a first direction DR1 and a second direction DR2, and the display area DA and the pixel area 100F have rectangular shapes. For example, the corner portions of the display area DA corresponding to the diagonal corner portions of the substrate 10F are substantially right-angled. The horizontal length of space occupied by the data divider 200 on the substrate 10F in the exemplary embodiment of FIG. 4C is less than the total horizontal length of the pixel area 100F. For example, the length of space occupied by the data divider 200 in the second direction DR2 is less than the length of space occupied by the pixel area 100F in the second direction DR2. Therefore, a sufficient amount of space in the diagonal corner portion(s) of the peripheral area PA in which various types of wires, lines, etc. are arranged is provided.

Figure 4D:
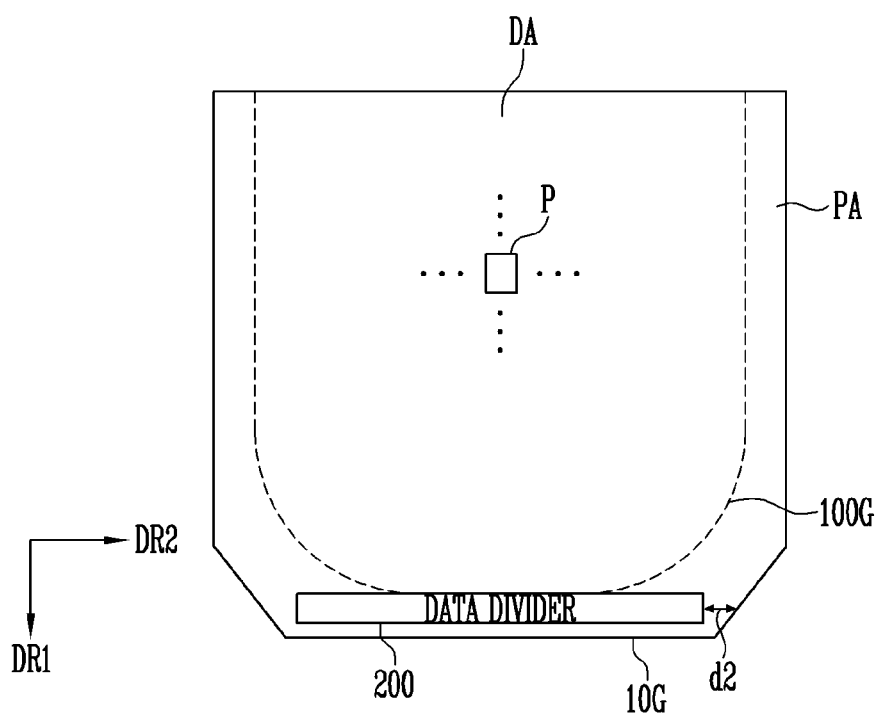

In an exemplary embodiment, as illustrated in FIG. 4D, at least one corner portion of the substrate 10G has a diagonal shape with respect to first and second directions DR1 and DR2, and at least one corner portion of each of the display area DA and the pixel area 100G has a curved shape. The horizontal length of space occupied by the data divider 200 on the substrate 10G of FIG. 4D is less than the total horizontal length of the pixel area 100G. For example, the length of space occupied by the data divider 200 in the second direction DR2 is less than the length of space occupied by the pixel area 100G in the second direction DR2. Therefore, a sufficient amount of space in the diagonal corner portion(s) of the peripheral area PA in which various types of wires, lines, etc. are arranged is provided.

It is to be understood that the planar shape of the substrate and the pixel area as described above according to exemplary embodiments of the present inventive concept is exemplary, and is not limited thereto.

Figure 5A:
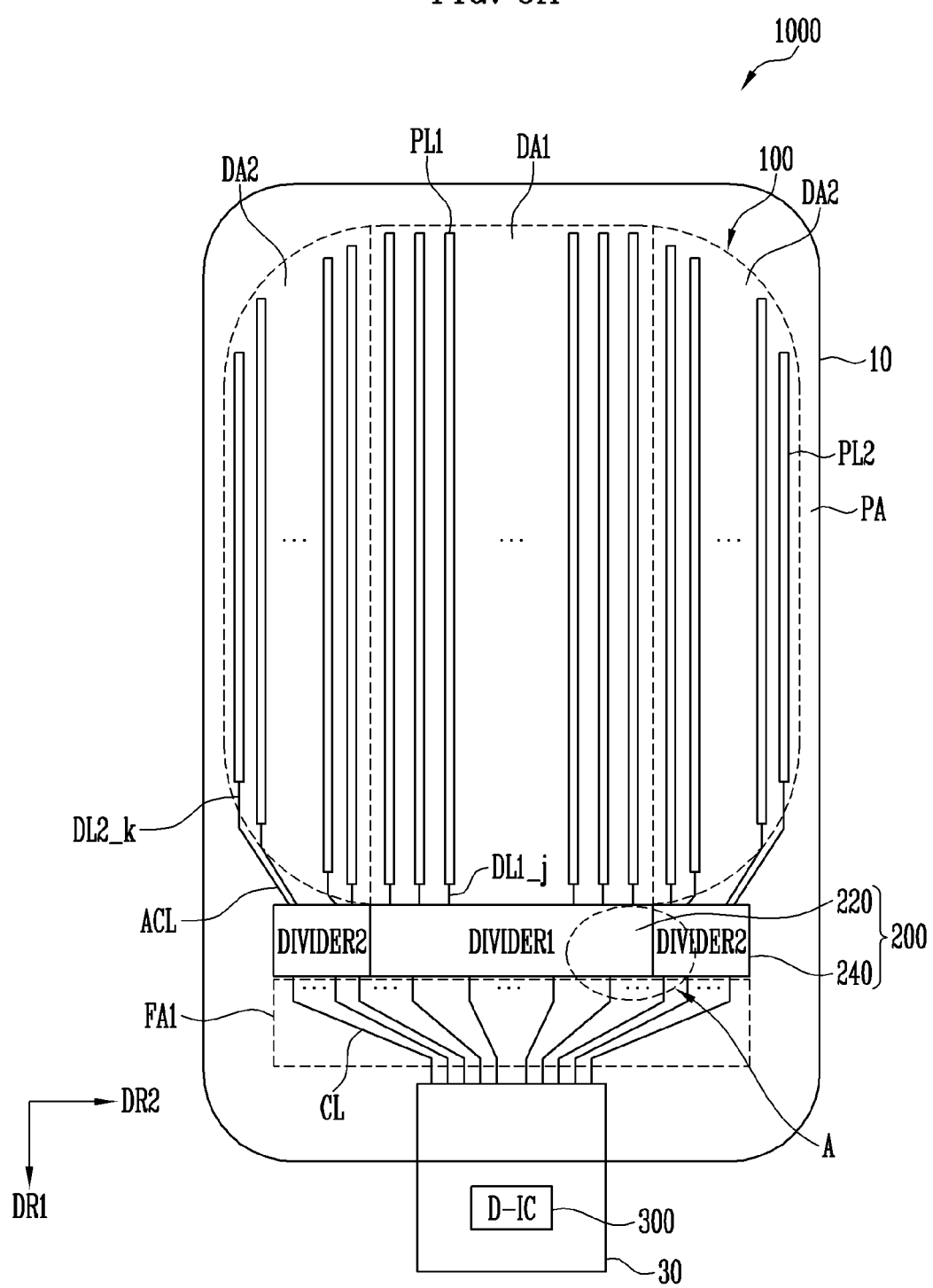
FIGS. 5A and 5B are views schematically illustrating examples of the display device of FIG. 1 according to exemplary embodiments of the present inventive concept.
Figure 5B:
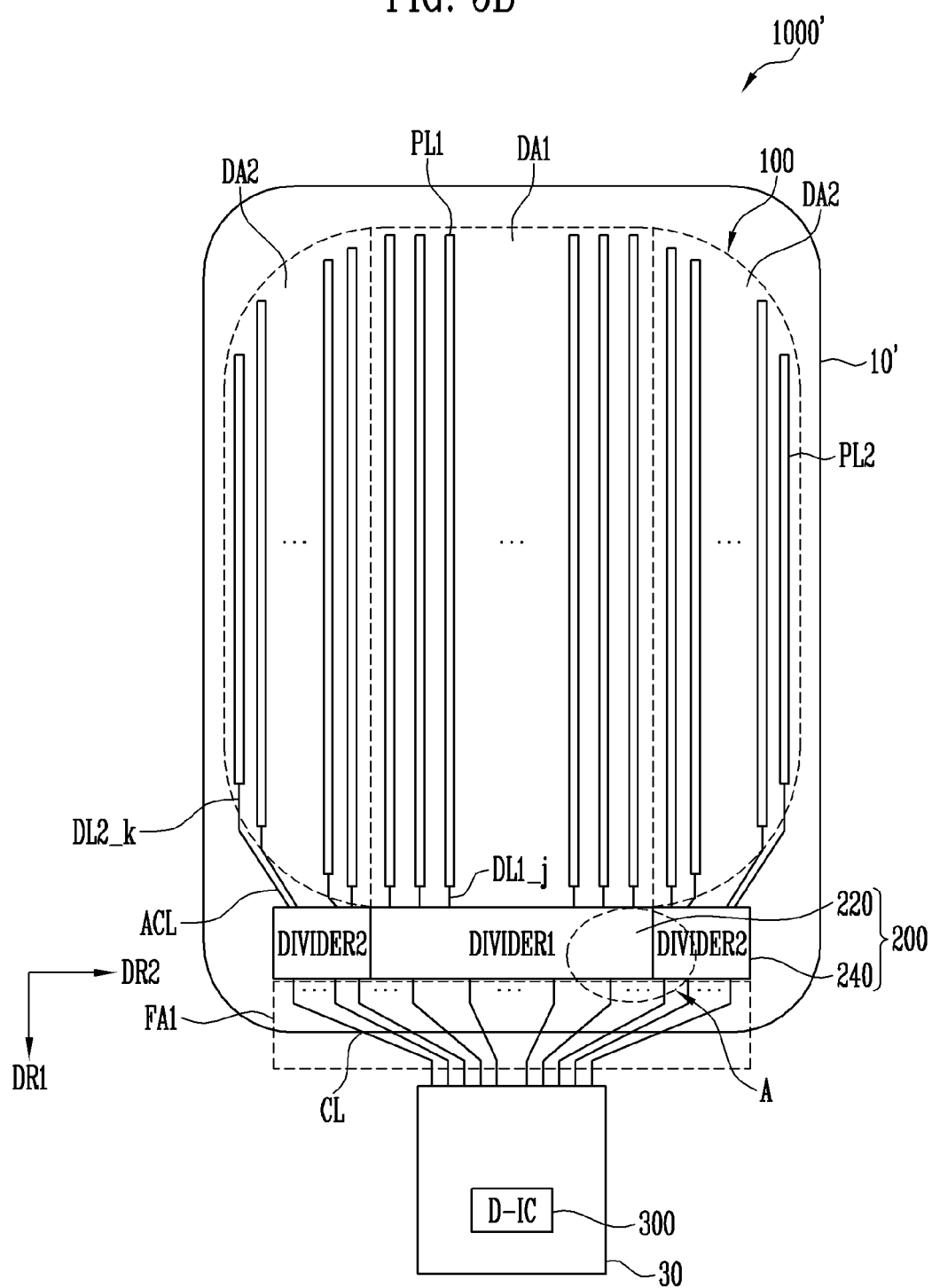

FIGS. 5A and 5B are views schematically illustrating an example of the display device of FIG. 1 according to exemplary embodiments of the present inventive concept.

Referring to FIGS. 5A and 5B, according to exemplary embodiments, a display device 1000 or 1000' includes a substrate 10 or 10', a pixel area 100, a data divider 200, a printed circuit film 30, and a plurality of coupling lines CL.

The display devices 1000 and 1000' of FIGS. 5A and 5B have a substantially identical configuration, except for the arrangement location of the printed circuit film 30. Thus, for convenience of explanation, a description of the exemplary embodiments shown in FIGS. 5A and 5B will be primarily made with reference to the display device 1000 shown in the exemplary embodiment of FIG. 5A.

The substrate 10 includes display areas DA1 and DA2 including the pixel area 100, and a peripheral area PA disposed adjacent to (e.g., disposed around) the display areas DA1 and DA2.

The substrate 10 has at least one corner portion that has a curved shape. For example, the substrate 10 may have the shape of a rectangle, and corner portions thereof may be formed to be curved. However, it is to be understood that this shape is exemplary, and that the planar shape of the substrate 10 is not limited thereto. The substrate 10 may be, for example, a flexible substrate or a rigid substrate. The display areas DA1 and DA2 may include a first display area DA1 and a second display area DA2 disposed adjacent to the first display area DA1 in a second direction DR2.

The pixel area 100 is arranged in the display areas DA1 and DA2 of the substrate 10. The pixel area 100 includes a plurality of first pixel lines PL1 and second pixel lines PL2 extending in a first direction DR1 (also referred to as a pixel column direction or a vertical direction). The first pixel lines PL1 are included in the first display area DA1 and are coupled to first area data lines DL1_j, respectively. The second pixel lines PL2 are included in the second display area DA2 and are coupled to second area data lines DL2_k, respectively. The first area data lines DL1_j are disposed in the first display area DA1, and the second area data lines DL2_k are disposed in the second display area DA2.

In an exemplary embodiment, the lengths of the second pixel lines PL2 are shorter than the lengths of the first pixel lines PL1. As a result, the number of effective pixels included in each of the second pixel lines PL2 is less than the number of effective pixels included in each of the first pixel lines PL1. The term "effective pixels" refers to pixels that actually emit light to allow a user to view an image. However, exemplary embodiments of the present inventive concept are not limited to the configuration described herein. For example, the lengths of the first pixel lines PL1 and the second pixel lines PL2 described herein, and the separation of the first display area DA1 and the second display area DA2 described herein, may vary in exemplary embodiments.

In the exemplary embodiment of FIG. 5A, the printed circuit film 30 is disposed in the peripheral area PA on the substrate 10. The printed circuit film 30 includes a data driver 300 that outputs data signals corresponding to the first and second pixel lines PL1 and PL2, respectively. The data driver 300 may be integrated on the printed circuit film 30 in the form of a data integrated circuit. The printed circuit film 30 may be implemented as, for example, a Tape Carrier Package (TCP), a Chip On Flexible Board (COF or Chip On Film), or a Flexible Printed Circuit film (FPC). The printed circuit film 30 may be coupled to a pad unit disposed in the peripheral area PA, and may be electrically coupled to the data divider 200 through the coupling lines CL. Accordingly, the data driver 300 may be electrically coupled to the data divider 200.

In an exemplary embodiment, the printed circuit film 30 may be implemented as a flexible printed circuit film, and may be attached to the substrate 10 in such a way that a part of the printed circuit film 30 is bent toward the rear surface of the substrate 10 to enclose one side surface of the substrate 10.

However, it is to be understood that this configuration is exemplary. For example, in exemplary embodiments, the data driver 300 may be directly mounted in the peripheral area PA of the substrate 10.

As shown in FIGS. 5A and 5B, in exemplary embodiments, the data divider 200 is disposed in the peripheral area PA of the substrate 10 between the pixel area 100 and the data driver 300. The data divider 200 includes a plurality of first selectors corresponding to a first selector area 220, and a plurality of second selectors corresponding to a second selector area 240. The first selectors are disposed in the first selector area 220 and transfer data signals to the first area data lines DL1_j. The second selectors are disposed in the second selector area 240 and transfer data signals to the second area data lines DL2_k. In an exemplary embodiment, distances between adjacent second selectors is shorter than distances between adjacent first selectors. The distances between the adjacent first selectors may be referred to as first distances, and the distances between the adjacent second selectors may be referred to as second distances. According to exemplary embodiments, the first area data lines DL1_j and the first selectors may be linearly and directly coupled to each other.

In exemplary embodiments, the distances between adjacent second selectors is decreased at predetermined intervals in a direction farther away from the first area DA1 (e.g., in a direction from the center of the pixel area 100 toward the outer edge of the pixel area 100). Here, additional coupling lines ACL that couple the second area data lines DL2_k to the second selectors, respectively, are utilized. The additional coupling lines ACL are disposed between the second selectors and the pixel area 100 in a second fan-out area FA2 included in the peripheral area PA. The arrangement structure of the first and second selectors 220 and 240 will be described in further detail with reference to FIG. 6.

Accordingly, in exemplary embodiments, the amount of space occupied by the data divider 200 in the peripheral area PA of the substrate 10 in the second direction DR2 may be reduced compared to that of a conventional structure, resulting in additional available space in the peripheral area PA in which other wires, drivers, etc. can be arranged.

According to exemplary embodiments, the plurality of coupling lines CL is arranged on one side of the peripheral area PA of the substrate 10. For example, in exemplary embodiments, the coupling lines CL are arranged in a fan-out area (e.g., a first fan-out area FA1) located between the data divider 200 and the printed circuit film 30 (or the data driver 300), and electrically couple the data driver 300 to the data divider 200. For example, the coupling lines CL may be coupled to a pad unit coupled to the printed circuit film 30. Distances between the data divider-side portions of the coupling lines CL may differ depending on distances between the selectors. For example, distances between the second selector-side portions of the adjacent coupling lines CL may be shorter than distances between the first selector-side portions of the adjacent coupling lines CL.

Accordingly, in exemplary embodiments, the amount of space occupied by the data divider 200 in the peripheral area PA of the substrate 10 in the second direction DR2 may be reduced compared to that of a conventional structure, resulting in additional available space in the peripheral area PA in which other wires, drivers, etc. can be arranged. Therefore, exemplary embodiments of the present inventive concept provide display panels having various shapes (e.g., a rounded display panel) without increasing additional dead space (e.g., without increasing the bezel).

As illustrated in FIG. 5B, in an exemplary embodiment, wires included in the fan-out area FA1 are bent toward the rear surface of the substrate 10' so that the wires enclose one side surface of the substrate 10'. In this case, the entire printed circuit film 30 may be attached to the rear surface of the substrate 10', allowing for the implementation of a narrower bezel.

Figure 6:
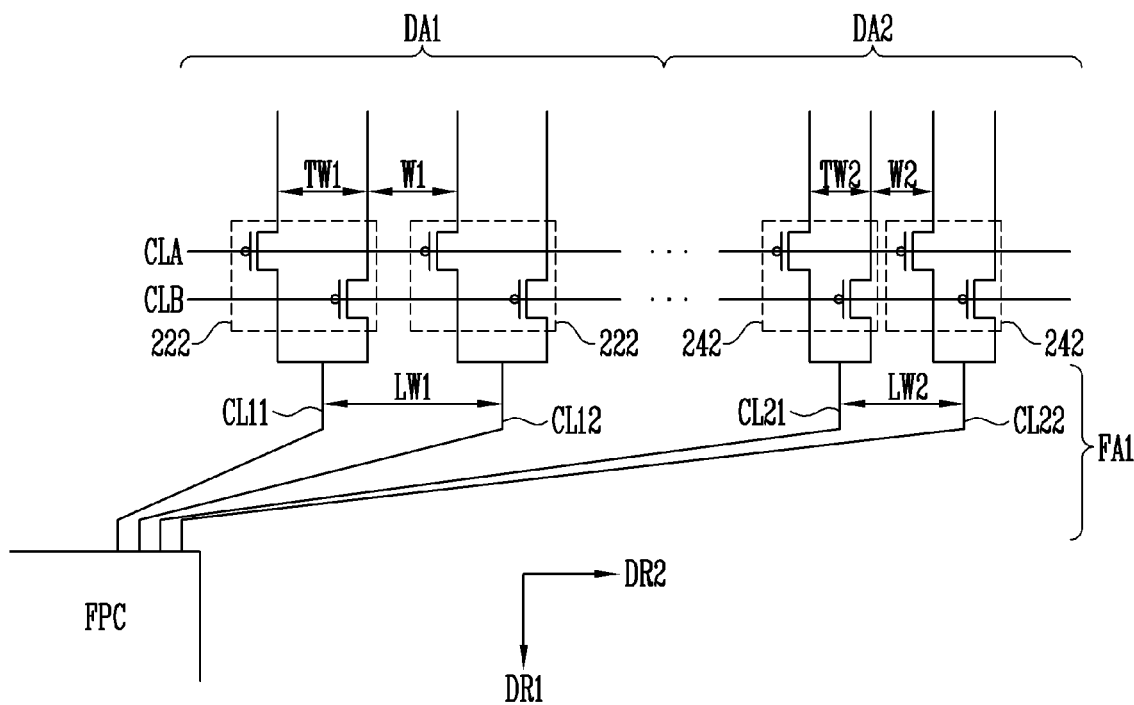
FIG. 6 is an enlarged view illustrating region "A" of the display device of FIG. 5A according to an exemplary embodiment of the present inventive concept.

FIG. 6 is an enlarged view illustrating region "A" of the display device of FIG. 5A according to an exemplary embodiment of the present inventive concept.

Referring to FIGS. 5A and 6, in an exemplary embodiment, the data divider 200 includes a plurality of first selectors 222 corresponding to the first display area DA1, and a plurality of second selectors 242 corresponding to the second display area DA2.

In an exemplary embodiment, each of the first selectors 222 and the second selectors 242 is implemented as a 1:N demultiplexer (where N is a positive integer equal to at least 2) that performs time-division driving. For example, the 1:N demultiplexer may include N switching transistors that are respectively controlled in response to N selection signals CLA and CLB having different timings. For example, each of the first and second selectors 222 and 242 may be implemented as a 1:2 demultiplexer having two switching transistors, a 1:3 demultiplexer having three switching transistors, or a 1:4 demultiplexer having four switching transistors. However, the configuration of the first and second selectors 222 and 242 is not limited thereto. FIG. 6 illustrates a case in which each of the first and second selectors 222 and 242 is a 1:2 demultiplexer.

The first selection signal CLA and the second selection signal CLB may turn on respective switching transistors at different timings. Therefore, time-division driving for data may be performed according to exemplary embodiments of the present invention.

A distance TW1 between switching transistors in each first selector 222 is referred to as a first internal distance. A distance W1 between adjacent first selectors 222 is referred to as a first distance. All of first selectors 222 have substantially the same first internal distance. Further, for all of the first selectors 222, the distances W1 between adjacent first selectors 222 has substantially the same first distance. However, exemplary embodiments of the present inventive concept are not limited thereto, and the first internal distance TW1 and the first distance W1 may differ depending on the first selectors 222.

In an exemplary embodiment, the first distance W1 and the first internal distance TW1 are substantially the same as each other. In this case, all transistors included in the first selectors 222 are arranged at regular intervals. In an exemplary embodiment, the first distance and the first internal distance may be different from each other.

In an exemplary embodiment, the distance between the switching transistors in each first selector 222 may be measured as a distance between source electrodes or drain electrodes of the switching transistors in the second direction DR2. Further, the distance between adjacent first selectors 222 may be a distance between adjacent switching transistors of the adjacent first selectors 222. Therefore, the first distance W1 may be measured as the distance between the source electrodes or the drain electrodes of adjacent switching transistors in different first selectors 222 in the second direction DR2.

A distance between switching transistors in each second selector 242 is referred to as a second internal distance. In an exemplary embodiment, the second internal distance TW2 between switching transistors in each second selector 242 is substantially the same as the first internal distance TW1 between switching transistors in each first selector 222. Thus, each of the first selectors 222 and each of the second selectors 242 may have substantially the same size.

A distance W2 between adjacent second selectors 242 is referred to as a second distance. All of the second selectors 242 may have substantially the same second internal distance TW2. Further, for all of the second selectors 242, the distances W2 between adjacent second selectors 242 may be substantially the same. However, exemplary embodiments of the present inventive concept are not limited thereto. For example, in exemplary embodiments, the second internal distance TW2 may differ for each second selector 242, and the second distance W2 between adjacent second selectors 242 may also differ.

The second distance W2 between adjacent second selectors 242 may be shorter than the first distance W1 between adjacent first selectors 222. Therefore, the amount of space occupied by the data divider 200 in the peripheral area PA of the substrate 10 in the second direction DR2 may be greatly decreased.

In an exemplary embodiment, first coupling lines CL11 and CL12 that couple the data driver 300 to the first selectors 222, and second coupling lines CL21 and CL22 that couple the data driver 300 to the second selectors 242, are arranged in a first fan-out area FA1. Each of the first coupling lines CL11 and CL12 includes a first selector-side portion (e.g., a portion of the coupling line closest to the first selectors 222) and a printed circuit film-side portion (also referred to as a data driver-side portion) (e.g., a portion of the coupling line closest to the printed circuit film/data driver). The first selector-side portion and the printed circuit film-side portion extend substantially in the first direction DR1. Each of the first coupling lines CL11 and CL12 further includes a diagonal portion which extends diagonally with respect to the first direction DR1 and the second direction DR2 between the first selector-side portion and the printed circuit film-side portion. The diagonal portion of each of the first coupling lines CL11 and CL12 connects the respective first selector-side portions and the printed circuit film-side portions to one another. Each of the second coupling lines CL21 and CL22 includes a second selector-side portion (e.g., a portion of the coupling line closest to the second selectors 242) and a printed circuit film-side portion (also referred to as a data driver-side portion) (e.g., a portion of the coupling line closest to the printed circuit film/data driver). The second selector-side portion and the printed circuit film-side portion extend substantially in the first direction DR1. Each of the second coupling lines CL21 and CL22 further includes a diagonal portion which extends diagonally with respect to the first direction DR1 and the second direction DR2 between the second selector-side portion and the printed circuit film-side portion. The diagonal portion of each of the second coupling lines CL21 and CL22 connects the respective second selector-side portions and the printed circuit film-side portions to one another.

In an exemplary embodiment, a distance LW2 between the second selector-side portions of adjacent second coupling lines CL21 and CL22 is shorter than a distance LW1 between the first selector-side portions of adjacent first coupling lines CL11 and CL12. The distance LW2 between the second selector-side portions of the second coupling lines CL21 and CL22 and the distance LW1 between the first selector-side portions of the first coupling lines CL11 and CL12 may correspond to respective distances between the coupling lines in the second direction DR2.

In an exemplary embodiment, the distance LW1 between the first coupling lines CL11 and CL12 is substantially the same for all of the first selectors 222, and the distance LW2 between the second coupling lines CL21 and CL22 is substantially the same for all of the second selectors 242. In an exemplary embodiment, the distance LW1 between the first coupling lines CL11 and CL12 is uniform, and the distance LW2 between the second coupling lines CL21 and CL22 is decreased at preset intervals in a direction farther away from the first display area DAL In an exemplary embodiment, the distance LW1 between the first coupling lines CL11 and CL12 is uniform, and the distance LW2 between the second coupling lines CL21 and CL22 is increased at preset intervals in a direction farther away from the first display area DAL In the exemplary embodiments described herein, the distance LW2 between the second coupling lines CL21 and CL22 is shorter than the distance LW1 between the first coupling lines CL11 and CL12.

As illustrated in FIG. 6, in an exemplary embodiment, the distance TW2 between the switching transistors in each second selector 242 is shorter than the distance TW1 between the switching transistors in each first selector 222. In this case, an area occupied by the data divider is further decreased.

Figure 7:
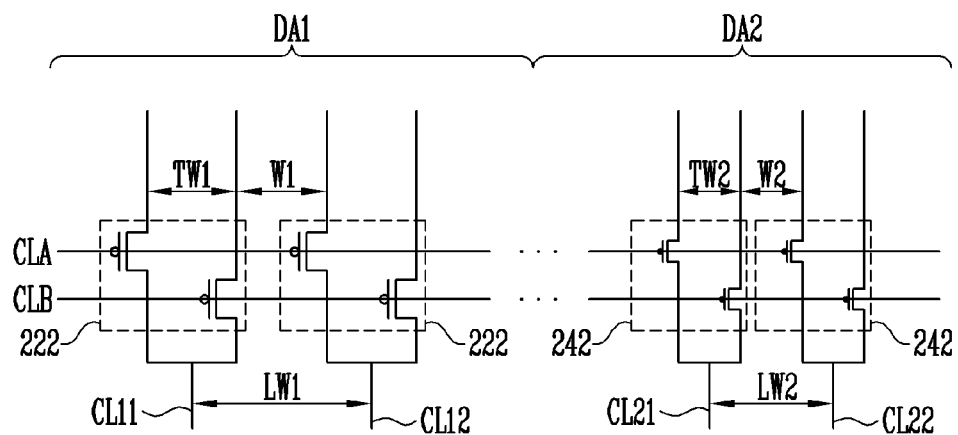
FIG. 7 is an enlarged view illustrating region "A" of the display device of FIG. 5A according to an exemplary embodiment of the present inventive concept.

In an exemplary embodiment, the distance between the adjacent first selectors 222 and the distance between the adjacent second selectors 242 are respective distances between adjacent switching transistors in different adjacent selectors FIG. 7 is an enlarged view illustrating region "A" of the display device of FIG. 5A according to an exemplary embodiment of the present inventive concept.

In FIG. 7, the same reference numerals are used to designate components similar or identical to those described with reference to FIG. 6. Thus, a repeated description thereof will be omitted. The data divider of FIG. 7 may have a configuration substantially identical or similar to that of the data divider of FIG. 6, except for the structure of second selectors.

Referring to FIG. 7, in an exemplary embodiment, a data divider 200 includes a plurality of first selectors 222 corresponding to a first display area DA1, and a plurality of second selectors 242 corresponding to a second display area DA2.

Each of the first and second selectors 222 and 242 may be implemented as, for example, a 1:2 demultiplexer having two switching transistors, a 1:3 demultiplexer having three switching transistors, or a 1:4 demultiplexer having four switching transistors.

A distance TW1 between switching transistors in each first selector 222 is referred to as a first internal distance, and a distance W1 between adjacent first selectors 222 is referred to as a first distance.

In an exemplary embodiment, the sizes of the switching transistors included in each of the second selectors 242 are smaller than the sizes of the switching transistors included in each of the first selectors 222. A distance TW2 between switching transistors in each second selector 242 is referred to as a second internal distance, and the size of each second selector 242 is less than that of each first selector 222.

A distance W2 between adjacent second selectors 242 is referred to as a second distance. According to exemplary embodiments, the second internal distance TW2 is shorter than the first internal distance TW1, and the second distance W2 is shorter than the first distance W1.

Accordingly, the amount of space occupied by the data divider 200 in the peripheral area PA of the substrate 10 in a second direction DR2 is greatly decreased according to exemplary embodiments of the present inventive concept. Therefore, a sufficient amount of space in the corner portions of the peripheral area PA in which various types of wires, lines, etc. are arranged is secured.

FIGS. 8A to 8E are diagrams schematically illustrating examples of the arrangement of the data divider included in the display device of FIG. 5A according to exemplary embodiments of the present inventive concept.

Referring to FIGS. 8A to 8E, in exemplary embodiments, the data divider 200 includes a first selector area 220 including a plurality of first selectors 222, and a second selector area 240 including a plurality of second selectors 242.

Figure 8C:
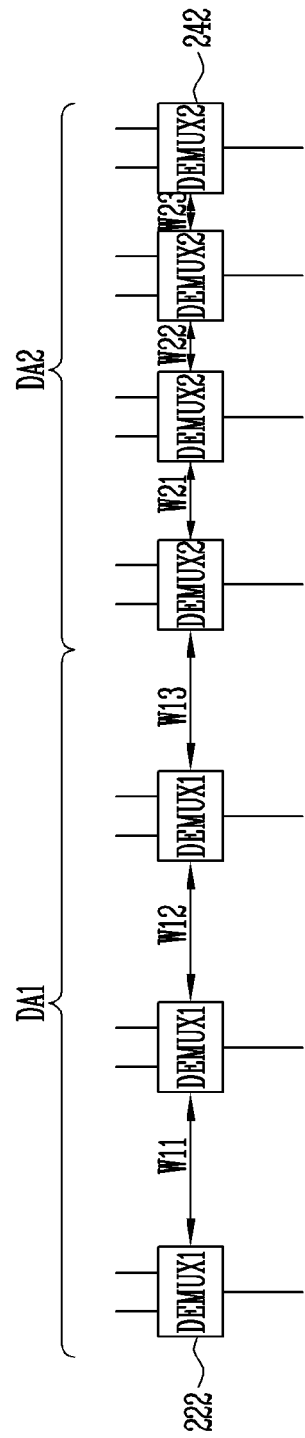
Figure 8D:
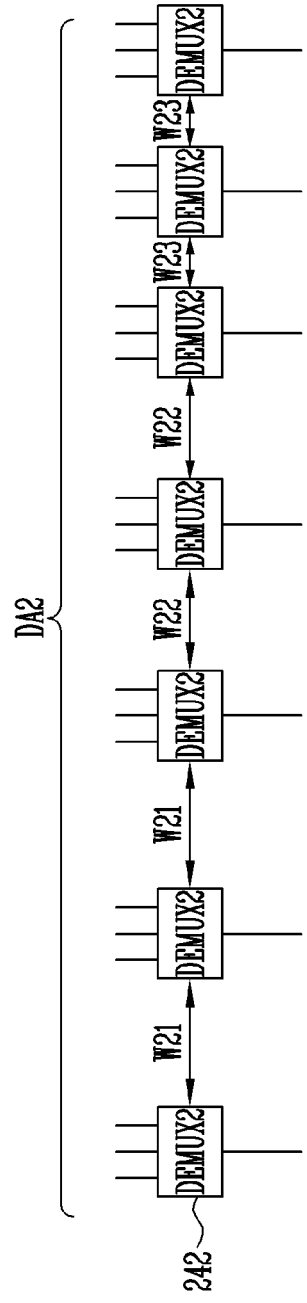
Figure 8E:
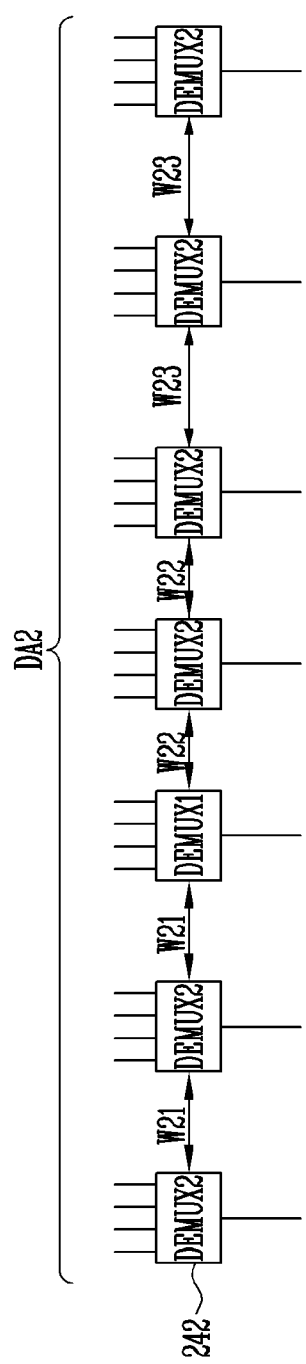

Each of the first selectors 222 and the second selectors 242 may be implemented as, for example, a 1:2 demultiplexer (see FIGS. 8A to 8C), a 1:3 demultiplexer (see FIG. 8D), or a 1:4 demultiplexer (see FIG. 8E).

The first selectors 222 are coupled to data lines that are coupled to pixels included in a first display area DA1 of a display area. The second selectors 242 are coupled to data lines that are coupled to pixels included in a second display area DA2 of the display area.

According to exemplary embodiments, distances between adjacent second selectors 242 are shorter than distances between adjacent first selectors 222.

As illustrated in FIG. 8A, in an exemplary embodiment, distances W1 between adjacent first selectors 222 in the first selector area 220 are referred to as first distances, and are substantially the same as one another. Distances W2 between adjacent second selectors 242 in the second selector area 240 are referred to as second distances, and are substantially the same as one another. The second distances are shorter than the first distances.

As illustrated in FIG. 8B, in an exemplary embodiment, distances W1 between adjacent first selectors 222 in the first selector area 220 are referred to as first distances, and are substantially the same as one another. In an exemplary embodiment, distances W21, W22, and W23 between adjacent second selectors 242 in the second selector area 240 decrease in a direction farther away from the first display area DAL For example, the distances W21, W22, and W23 between adjacent selectors 242 become shorter in a direction toward the outer edge of the display panel. For example, distance W23 is shorter than distance W22, and distance W22 is shorter than distance W21. In the exemplary embodiment of FIG. 8B, distances LW21, LW22, and LW23 refer to distances between the second coupling lines corresponding to the second selector area 240.

As illustrated in FIG. 8C, in an exemplary embodiment, distances W11, W12, and W13 between adjacent first selectors 222 become shorter in a direction toward (closer to) the outer edge of the display panel (e.g., the substrate). Distances W21, W22, and W23 between adjacent second selectors 242 also become shorter in a direction closer to the outer edge of the display panel. In an exemplary embodiment, the maximum distance of the distances W21, W22, and W23 between the second selectors 242 is shorter than the minimum distance of the distances W11, W12, and W13 between the first selectors 222.

As illustrated in FIGS. 8D and 8E, in exemplary embodiments, distances W21, W22, and W23 between adjacent second selectors 242 in the second selector area 240 are changed at preset intervals. In an exemplary embodiment, the distances W21, W22, and W23 between the second selectors 242 are decreased in a direction toward the outer edge of the display panel (e.g., in a direction farther away from the first display area DA1). The distances W21, W22, and W23 between the second selectors 242 are also increased in the direction toward the outer edge of the display panel (e.g., in the direction farther away from the first display area DA1). Alternatively, the distances W21, W22, and W23 between the second selectors 242 may be set through optimal arrangement within a range narrower than the minimum distance of the distances between the first selectors 222.

Accordingly, in exemplary embodiments of the present inventive concept, the space occupied by the data divider 200 in the peripheral area PA of the substrate may be greatly decreased. Therefore, a sufficient amount of space in the corner portions of the peripheral area PA in which various types of wires, lines, etc. are arranged is secured.

Figure 9:
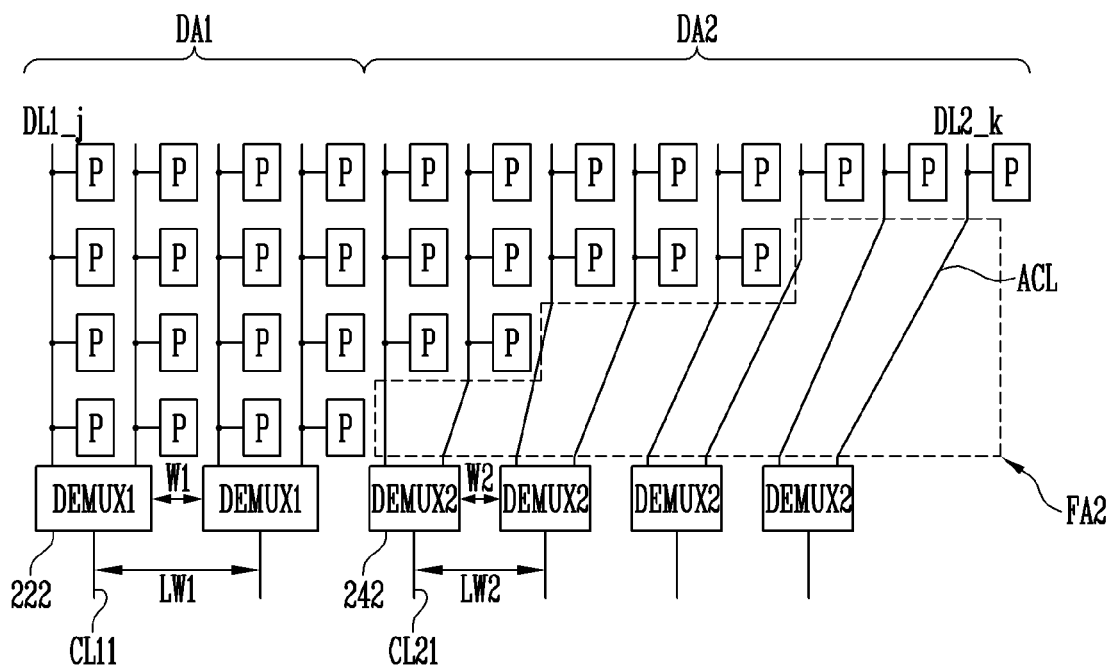
FIG. 9 is a diagram illustrating an example of a coupling structure between the data divider and data lines included in the display device of FIG. 5A according to an exemplary embodiment of the inventive concept.
Figure 10:
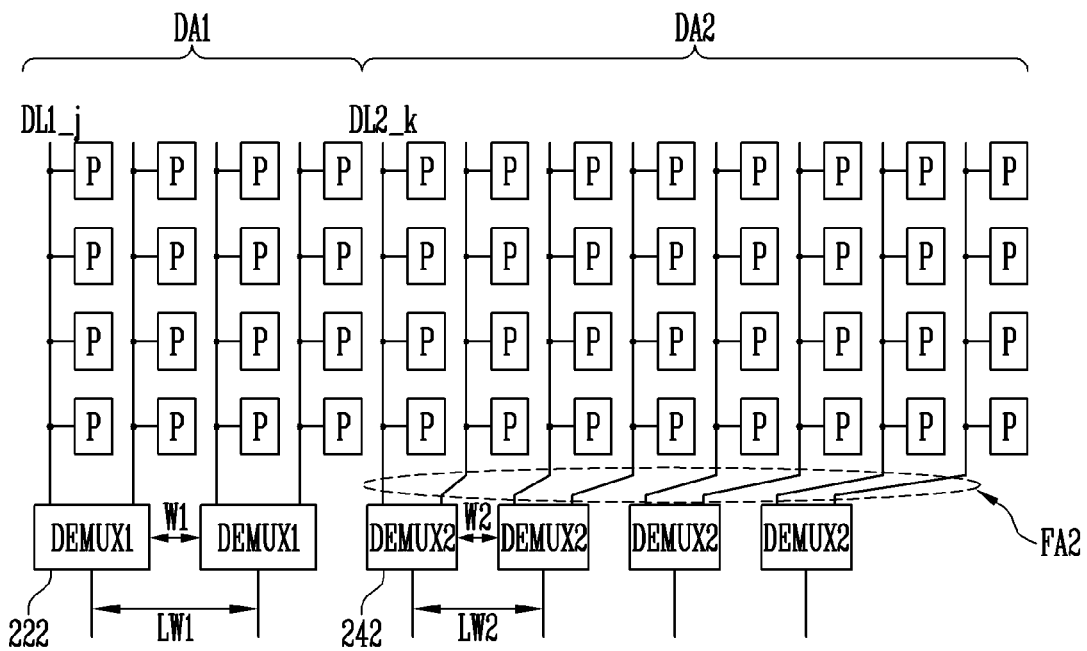
FIG. 10 is a diagram illustrating an example of a coupling structure between the data divider and data lines included in the display device of FIG. 5A according to an exemplary embodiment of the inventive concept.
Figure 11:
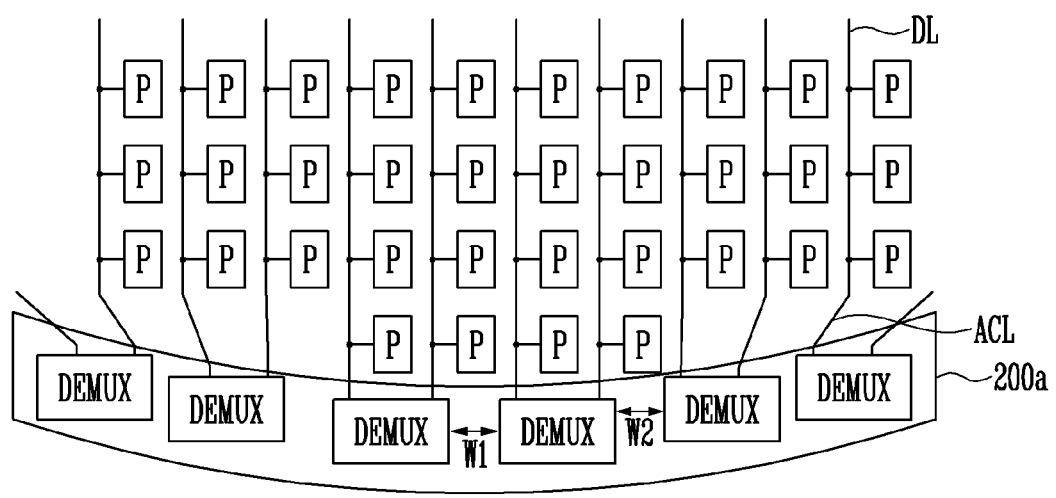
FIG. 11 is a diagram illustrating an example of a coupling structure between the data divider and data lines included in the display device of FIG. 5A according to an exemplary embodiment of the inventive concept.

FIG. 9 is a diagram illustrating an example of a coupling structure between the data divider and data lines included in the display device of FIG. 5A according to an exemplary embodiment of the present inventive concept. FIG. 10 is a diagram illustrating an example of a coupling structure between the data divider and data lines included in the display device of FIG. 5A according to an exemplary embodiment of the present inventive concept. FIG. 11 is a diagram illustrating an example of a coupling structure between the data divider and data lines included in the display device of FIG. 5A according to an exemplary embodiment of the present inventive concept.

Referring to FIGS. 5A and 9 to 11, the data divider 200 is electrically coupled to data lines DL1_j and DL2_k included in the pixel area 100.

The pixel lines PL1 and PL2 (e.g., pixel columns) included in the pixel area 100 of FIG. 9 are shortened in a direction toward the outer edge of the pixel area 100.

In an exemplary embodiment, the first area data lines DL1_j and the second area data lines DL2_k are arranged substantially in parallel to the pixel lines (e.g., vertical lines or pixel columns).

In an exemplary embodiment, each first selector 222 is electrically coupled to the printed circuit film 30 (e.g., the data driver 300) through a single first coupling line CL11, and each second selector 242 is electrically coupled to the printed circuit film 30 through a single second coupling line CL21. In an exemplary embodiment, a horizontal distance LW1 between first selector-side portions of the first coupling lines CL11 is longer than a horizontal distance LW2 between second selector-side portions of the second coupling lines CL21.

Each first selector 222 is electrically coupled to the first area data lines DL1_j. For example, a single first selector 222 may be coupled to two first area data lines DL1_j. However, the number of first area data lines DL1_j coupled to the single first selector 222 is not limited thereto. In an exemplary embodiment, the first selectors 222 are directly coupled to the first area data lines DL1_j. For example, the first selectors 222 may be arranged at intervals matching respective first area data lines DL1_j. Therefore, in an exemplary embodiment, for the first selectors 222, there may not be coupling lines which will mediate electrical coupling to the first area data lines DL1_j. Alternatively, the first area data lines DL1_j and the first selectors 222 may be substantially linearly coupled to each other. Accordingly, the first selectors 222 may be arranged at substantially regular first intervals W1 in accordance with the pixel columns (pixel lines) or the first area data lines DL1_j.

Each second selector 242 is electrically coupled to the second area data lines DL2_k. For example, a single second selector 242 may be electrically coupled to two second area data lines DL2_k. However, the number of second area data lines DL2_k to be electrically coupled to the single second selector 242 is not limited thereto. Each second selector 242 may be electrically coupled to the second area data lines DL2_k through additional coupling lines ACL included in a second fan-out area FA2 of the peripheral area PA. In an exemplary embodiment, the second selectors 242 are arranged at narrower intervals in a direction closer to the outer edge (e.g., corner portions) of the pixel area 100. Accordingly, mismatching may occur between the second selectors 242 and the second area data lines DL2_k corresponding thereto. Therefore, a plurality of additional coupling lines ACL may be further included in the peripheral area PA between the second selectors 242 and the second area data lines DL2_k. The additional coupling lines ACL may be arranged diagonally with respect to the second area data lines DL2_k.

In an exemplary embodiment, in the first display area DA1, the first selectors 222 are directly coupled to the first area data lines DL1_j, and in the second area DA2, the second selectors 242 and the second area data lines DL2_k are electrically coupled to each other through the additional coupling lines ACL that are diagonally arranged.

Accordingly, in exemplary embodiments of the present inventive concept, the amount of space horizontally occupied by the data divider 200 in the peripheral area PA of the substrate 10 may be decreased, while the data divider 200 may be stably electrically coupled to the data lines.

As illustrated in FIG. 10, in an exemplary embodiment, all pixel lines have substantially the same length.

As illustrated in FIG. 11, in an exemplary embodiment, one side of the pixel area adjacent to a data divider 200a has a curved shape. In this case, selectors included in the data divider 200a may be arranged in the shape of steps along the boundary of the pixel unit. Further, the selectors may be arranged at narrower intervals in a direction closer to the outer edge of the pixel area from the center thereof. Further, due to the difference in distance between the selectors, additional coupling lines ACL for electrically coupling the selectors to data lines DL corresponding thereto may be further arranged.

As described above, the display device 1000 according to exemplary embodiments of the present inventive concept may be implemented using various types of substrates 10, the corner portions of which have a rounded shape (curved shape), a diagonal shape, etc. The display device 1000 includes the data divider 200 or 200a in which the second selectors 242 are arranged at intervals narrower than those of the first selectors 222, resulting in greatly reducing the amount of space horizontally occupied by the data divider 200 or 200a in the peripheral area PA of the substrate 10. Therefore, a sufficient amount of space in the corner portions of the peripheral area PA in which various types of wires, lines, etc. are arranged may be secured.

Exemplary embodiments of the present inventive concept may be applied to any electronic device including a display. For example, exemplary embodiments of the present inventive concept may be applied to a head-mounted display (HMD) device, a television (TV), a digital TV, a three-dimensional (3D) TV, a personal computer (PC), a home appliance, a notebook computer, a tablet computer, a mobile phone, a smartphone, a personal digital assistant (PDA), a portable multimedia player (PMP), a digital camera, an audio player, a portable game console, a navigation device, a wearable display device, etc.

As described above, the display device according to exemplary embodiments of the present inventive concept may be implemented using various types of substrates, the corner portions of which have a rounded shape (curved shape), a diagonal shape, etc. The display device includes a data divider in which second selectors are arranged at intervals narrower than those of first selectors, and thus, the amount of space horizontally occupied by the data divider in the peripheral area of a substrate may be greatly reduced. Therefore, a sufficient amount of space in the corner portions of the peripheral area in which various types of wires, lines, etc. are arranged may be secured.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
    a substrate comprising a display area and a peripheral area adjacent to the display area;
    a pixel area disposed in the display area, wherein the pixel area comprises first pixel lines disposed in a first area of the display area and respectively coupled to first area data lines, and second pixel lines disposed in a second area of the display area and respectively coupled to second area data lines;
    a data driver configured to output data signals;
    a data divider disposed in the peripheral area between the pixel area and the data driver, wherein the data divider comprises first selectors configured to transfer the data signals to the first area data lines, and second selectors configured to transfer the data signals to the second area data lines; and
    coupling lines configured to couple the data driver to the data divider,
    wherein each of the first selectors includes a same number of switching transistors as each of the second selectors,
    wherein a distance between adjacent switching transistors included in each of the second selectors is shorter than a distance between adjacent switching transistors included in each of the first selectors,
    wherein the switching transistors of the first selectors and the first area data lines are electrically connected one-to-one and the switching transistors of the second selectors and the second area data lines are electrically connected one-to-one, and
    wherein a distance in a horizontal direction between adjacent second selectors is shorter than a distance in the horizontal direction between adjacent first selectors in the horizontal direction.

2. The display device according to claim 1, wherein at least one corner portion of the substrate has either a curved shape or a diagonal shape with respect to the first and second pixel lines.

3. The display device according to claim 1, wherein the first area data lines are closer to a center of the pixel area than the second area data lines.

4. The display device according to claim 1, wherein the first and second pixel lines correspond to respective pixel columns, and lengths of the second pixel lines are shorter than lengths of the first pixel lines.

5. The display device according to claim 4, wherein the second area includes a corner portion of the pixel area.

6. The display device according to claim 4, wherein a number of effective pixels included in each of the second pixel lines is less than a number of effective pixels included in each of the first pixel lines.

7. The display device according to claim 1, wherein the distance between the adjacent second selectors is decreased at preset intervals in a direction farther away from the first area.

8. The display device according to claim 1, wherein each of the first selectors and the second selectors is a 1:N demultiplexer configured to perform time-division driving for data, wherein N is a positive integer equal to at least 2.

9. The display device according to claim 8, wherein the 1:N demultiplexer comprises N switching transistors that are respectively controlled in response to N selection signals having different timings.

10. The display device according to claim 1, wherein the distance between the adjacent first selectors and the distance between the adjacent second selectors are respective distances between adjacent switching transistors in different adjacent selectors.

11. The display device according to claim 1, wherein sizes of the switching transistors included in each of the second selectors are smaller than sizes of the switching transistors included in each of the first selectors.

12. The display device according to claim 1, wherein the coupling lines comprise:
    first coupling lines configured to couple the data driver to the respective first selectors; and
    second coupling lines configured to couple the data driver to the respective second selectors, and
    wherein distances between second selector-side portions of adjacent second coupling lines are shorter than distances between first selector-side portions of adjacent first coupling lines.

13. The display device according to claim 12, wherein the distances between the selector-side portions of the adjacent second coupling lines are decreased at preset intervals in a direction farther away from the first area.

14. The display device according to claim 1, further comprising:
    a plurality of additional coupling lines configured to couple the second area data lines to the respective second selectors,
    wherein the first area data lines and the second area data lines extend substantially parallel to the first and second pixel lines, and the additional coupling lines extend diagonally with respect to the second area data lines.

15. The display device according to claim 1, wherein a horizontal length of space occupied by the data divider is less than a maximum horizontal length of the pixel area.

16. A display device, comprising:
    a substrate comprising a display area and a peripheral area adjacent to the display area in a first direction;
    a pixel area disposed in the display area, wherein the pixel area comprises pixels disposed in a first area of the display area and respectively coupled to first area data lines, and second pixels disposed in a second area of the display area and respectively coupled to second area data lines;
    a data driver configured to output data signals;
    a data divider disposed in the peripheral area between the pixel area and the data driver, wherein the data divider comprises first selectors configured to transfer the data signals to the first area data lines, and second selectors configured to transfer the data signals to the second area data lines;

first coupling lines configured to couple the data driver to the respective first selectors; and second coupling lines configured to couple the data driver to the respective second selectors, wherein a distance in the first direction between second selector-side portions of adjacent second coupling lines connected to adjacent second selectors disposed in the second selector area is shorter than a distance in the first direction between first selector-side portions of adjacent first coupling lines connected to adjacent first selectors disposed in the first selector area.

17. The display device according to claim 16, wherein at least one corner portion of the substrate has either a curved shape or a diagonal shape with respect to the first and second pixel lines.

18. The display device according to claim 16, wherein the distance between the second selector-side portions of the adjacent second coupling lines is decreased at preset intervals in a direction farther away from the first area.

19. The display device according to claim 16, wherein the distance between the first selector-side portions of the adjacent first coupling lines is a first line distance, and the distance between the second selector-side portions of the adjacent second coupling lines is a second line distance shorter than the first line distance.

20. The display device according to claim 16, further comprising:
a plurality of additional coupling lines configured to couple the second area data lines to the respective second selectors,
wherein the additional coupling lines extend diagonally with respect to the second area data lines.

* * * * *